US012787541B2

(12) United States Patent
Lee et al.

(10) Patent No.: US 12,787,541 B2
(45) Date of Patent: Nov. 3, 2026

(54) LIGHT EMITTING DEVICE AND LIGHT EMITTING DISPLAY DEVICE INCLUDING THE SAME

(71) Applicant: LG Display Co., Ltd., Seoul (KR)

(72) Inventors: Dong Ik Lee, Paju-si (KR); Jin Hwan Park, Paju-si (KR); Ji Yun Kim, Paju-si (KR); Dong Hyuk Kim, Paju-si (KR); Yong Hwan Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 481 days.

(21) Appl. No.: 18/375,715

(22) Filed: Oct. 2, 2023

(65) Prior Publication Data

US 2024/0260304 A1 Aug. 1, 2024

(30) Foreign Application Priority Data

Jan. 30, 2023 (KR) ........................ 10-2023-0012191

(51) Int. Cl.
*H10K 50/19* (2023.01)
*H10K 50/13* (2023.01)

(52) U.S. Cl.
CPC ........... *H10K 50/19* (2023.02); *H10K 50/131* (2023.02)

(58) Field of Classification Search
CPC ...... H10K 50/19; H10K 50/131; H10K 50/00; H10K 2101/90; H10K 2102/351; H10K 50/11; H10K 50/12; H10K 50/13; H10K 59/12; H10K 2101/10; H10K 2101/30; H10K 2101/40; H10K 50/15; H10K 59/124; H10K 59/805
See application file for complete search history.

(56) References Cited

U.S. PATENT DOCUMENTS

| | | | | |
|---|---|---|---|---|
| 2008/0231177 A1* | 9/2008 | Nomura | ................. | H05B 33/18 313/504 |
| 2021/0175456 A1* | 6/2021 | Song | ...................... | H10K 50/11 |
| 2021/0175457 A1* | 6/2021 | Park | ........................ | H10K 50/11 |
| 2022/0199680 A1* | 6/2022 | Lee | ...................... | H10K 59/875 |
| 2022/0310931 A1* | 9/2022 | Jing | ..................... | H10K 85/631 |
| 2023/0255045 A1* | 8/2023 | Wen | ..................... | H10K 50/181 257/40 |

FOREIGN PATENT DOCUMENTS

| | | |
|---|---|---|
| JP | 4974941 B2 | 7/2012 |
| KR | 10-2007-0101516 A | 10/2007 |
| KR | 10-2022-0067171 A | 5/2022 |

* cited by examiner

*Primary Examiner* — Christine S. Kim
*Assistant Examiner* — Nathalie R Fayette
(74) *Attorney, Agent, or Firm* — Birch, Stewart, Kolasch & Birch, LLP

(57) ABSTRACT

A light emitting device includes a first electrode and a second electrode facing each other on a substrate, and an intermediate layer including a first blue stack, a first charge generation layer, and a phosphorescent stack between the first electrode and the second electrode. The first blue stack includes a hole transport layer, a first blue light-emitting layer, a second blue light-emitting layer, and an electron transport layer in this order. Further, the first blue light-emitting layer includes a first host and a blue dopant, and the second blue light-emitting layer includes a second host and the blue dopant. Also, a triplet energy level of the first host is greater than a triplet energy level of the second host and is smaller than a triplet energy level of the dopant.

23 Claims, 16 Drawing Sheets

LIGHT EMITTING DEVICE AND LIGHT EMITTING DISPLAY DEVICE INCLUDING THE SAME

CROSS-REFERENCE TO RELATED APPLICATIONS

This application claims priority to Korean Patent Application No. 10-2023-0012191, filed in the Republic of Korea on Jan. 30, 2023, the entire disclosure of which is hereby expressly incorporated by reference into the present application.

BACKGROUND OF THE INVENTION

Field of the Invention

The disclosure relates to a light emitting device and a light emitting display device including the same.

Discussion of the Related Art

A light emitting display device, which does not require a separate light source to realize slimness or flexibility and which includes a light emitting device in a display pixel, is considered as a competitive application.

A light emitting device used in the light emitting display device needs higher efficiency in order to exhibit high image quality.

Meanwhile, a tandem-type light emitting device including light-emitting layers emitting light of different colors in different stacks is considered.

SUMMARY OF THE INVENTION

Accordingly, the disclosure is directed to a light emitting device and a light emitting display device that substantially obviate one or more problems due to the limitations and disadvantages of the related art.

A light emitting display device includes light emitting devices that emit white light using light-emitting layers of different colors. A tandem light emitting device designed to satisfy a certain or higher luminance and to include light-emitting layers with different efficiencies has a problem in which light emission of a specific color is relatively prominent during low-gradation driving.

The light emitting device and the light emitting display device according to one or more embodiments of the present disclosure aim at addressing this limitation, and can increase the emission zone, improve efficiency, and improve lifespan by changing the structure of the blue light-emitting layer.

Additional advantages, objects, and features of the disclosure will be set forth in part in the description which follows and in part will become apparent to those having ordinary skill in the art upon examination of the following, or can be learned from practice of the disclosure. The objectives and other advantages of the disclosure can be realized and attained by the structure particularly pointed out in the written description and claims hereof as well as the appended drawings.

To achieve these objects and other advantages and in accordance with the purpose of the disclosure, as embodied and broadly described herein, a light emitting device includes a first electrode and a second electrode facing each other on a substrate, and an intermediate layer including a first blue stack, a first charge generation layer, and a phosphorescent stack between the first electrode and the second electrode, wherein the first blue stack includes a hole transport layer, a first blue light-emitting layer, a second blue light-emitting layer, and an electron transport layer in this order, the first blue light-emitting layer includes a first host and a blue dopant, and the second blue light-emitting layer includes a second host and the blue dopant, and a triplet energy level of the first host is greater than a triplet energy level of the second host and is smaller than a triplet energy level of the dopant.

In accordance with another aspect of the present disclosure, provided is a light emitting device including a first electrode and a second electrode facing each other on a substrate, and an intermediate layer including a first blue stack, a first charge generation layer, a phosphorescent stack, and a second blue stack between the first electrode and the second electrode, wherein the first blue stack includes a first hole transport layer, a first blue light-emitting portion, and a first electron transport layer in this order, the second blue stack includes a second hole transport layer, a second blue light-emitting portion, and a second electron transport layer in this order, at least one of the first blue light-emitting portion or the second blue light-emitting portion has first and second blue light-emitting layers, and the first and second blue light-emitting layers have the same blue dopant and have different first and second hosts, and a triplet energy level of the first host is greater than a triplet energy level of the second host and is smaller than a triplet energy level of the blue dopant.

In accordance with another aspect of the present disclosure, provided is a light emitting display device including a substrate including a plurality of sub-pixels, a thin film transistor provided in each sub-pixel on the substrate and a light emitting device connected to the thin film transistor and provided on an insulating film having a surface curvature, wherein the light emitting device includes a first electrode and a second electrode facing each other, and a first blue stack, a first charge generation layer, a phosphorescent stack, and a second blue stack between the first electrode and the second electrode, the first blue stack includes a first hole transport layer, a first blue light-emitting portion, and a first electron transport layer in this order, the second blue stack includes a second hole transport layer, a second blue light-emitting portion, and a second electron transport layer in this order, at least one of the first blue light-emitting portion or the second blue light-emitting portion has first and second blue light-emitting layers, and the first and second blue light-emitting layers have the same blue dopant and have different first and second blue hosts, and a triplet energy level of the first host is greater than a triplet energy level of the second host and is smaller than a triplet energy level of the blue dopant.

It is to be understood that both the foregoing general description and the following detailed description of the disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE EMBODIMENTS

Figure 1:
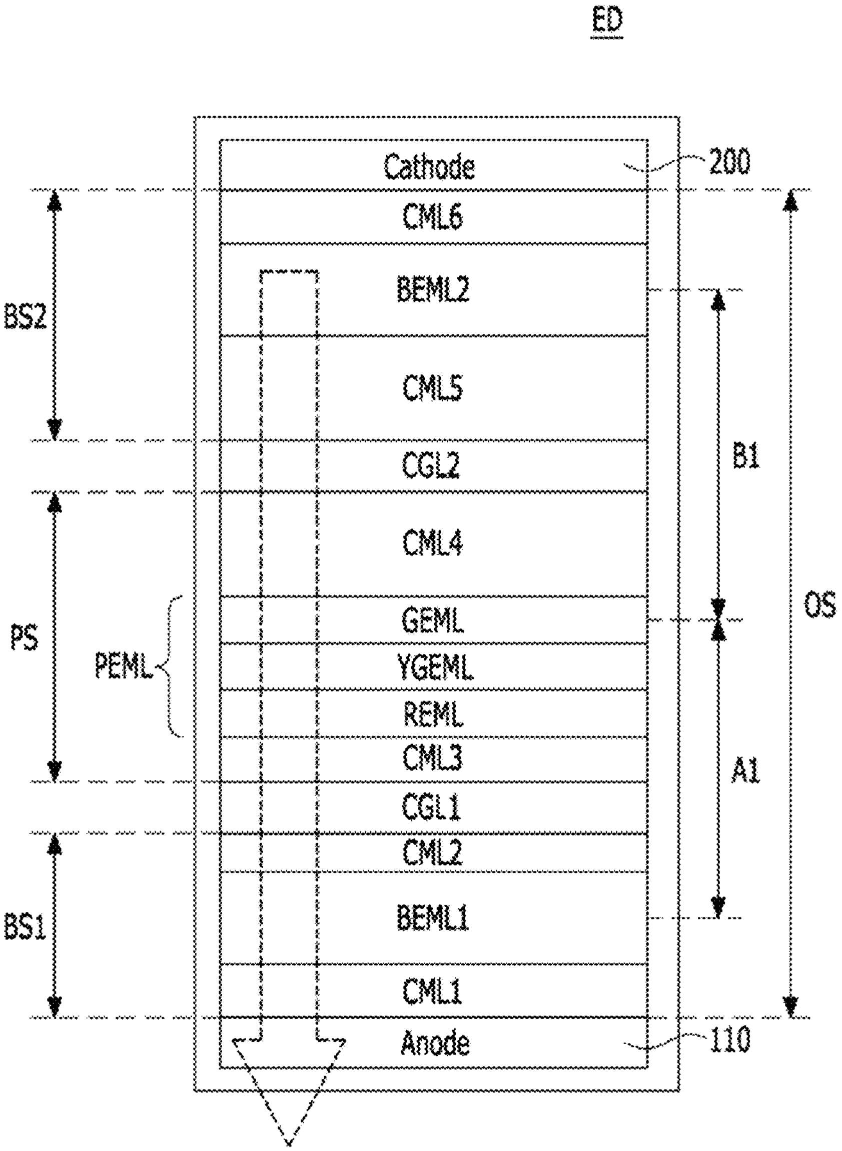
FIG. 1 is a cross-sectional view schematically illustrating a light emitting device according to a first embodiment of the present disclosure.

Reference will now be made in detail to the preferred embodiments of the present invention, examples of which are illustrated in the accompanying drawings. Wherever possible, the same reference numbers will be used throughout the drawings to refer to the same or like parts. In the following description of the present invention, detailed descriptions of known functions and configurations incorporated herein will be omitted when the same can obscure the subject matter of the present invention. In addition, the names of elements used in the following description are selected in consideration of clear description of the specification, and can differ from the names of elements of actual products.

The shape, size, ratio, angle, number, and the like shown in the drawings to illustrate various embodiments of the present invention are merely provided for illustration, and are not limited to the content shown in the drawings. Wherever possible, the same reference numbers will be used throughout the drawings to refer to the same or like parts. In the following description, detailed descriptions of technologies or configurations related to the present invention can be omitted so as to avoid unnecessarily obscuring the subject matter of the present invention. When terms such as "including", "having", and "comprising" are used throughout the specification, an additional component can be present, unless "only" is used. A component described in a singular form encompasses a plurality thereof unless particularly stated otherwise.

The components included in the embodiments of the present invention should be interpreted to include an error range, even if there is no additional particular description thereof.

In describing a variety of embodiments of the present invention, when terms for positional relationships such as "on", "above", "under" and "next to" are used, at least one intervening element can be present between two elements, unless "immediately" or "directly" is used.

In describing a variety of embodiments of the present invention, when terms related to temporal relationships, such as "after", "subsequently", "next" and "before", are used, the non-continuous case can be included, unless "immediately" or "directly" is used.

In describing a variety of embodiments of the present invention, terms such as "first" and "second" can be used to describe a variety of components, but these terms only aim to distinguish the same or similar components from one another and may not define order or sequence. Accordingly, throughout the specification, a "first" component can be the same as a "second" component within the technical concept of the present invention, unless specifically mentioned otherwise.

Features of various embodiments of the present disclosure can be partially or completely coupled to or combined with each other, and can be variously inter-operated with each other and driven technically. The embodiments of the present disclosure can be carried out independently from each other, or can be carried out together in an interrelated manner.

As used herein, the term "doped" means that, in a material that occupies most of the weight ratio of a layer, a material (for example, N-type and P-type materials, or organic and inorganic substances) having physical properties different from the material that occupies most of the weight ratio of the layer is added in an amount of less than 30% by weight. In other words, the "doped" layer refers to a layer that is used to distinguish a host material from a dopant material of a certain layer, in consideration of the specific gravity of the weight ratio. Further, the term "undoped" refers to any case other than a "doped" case. For example, when a layer contains a single material or a mixture of materials having the same properties as each other, the layer is included in the "undoped" layer. For example, if at least one of the materials constituting a certain layer is p-type and not all materials constituting the layer are n-type, the layer is included in the "undoped" layer. For example, if at least one of materials constituting a layer is an organic material and not all materials constituting the layer are inorganic materials, the layer is included in the "undoped" layer. For example, when all materials constituting a certain layer are organic materials, at least one of the materials constituting the layer is n-type and the other is p-type, when the n-type material is present in an amount of less than 30 wt %, or when the p-type material is present in an amount of less than 30 wt %, the layer is considered a "doped" layer.

Reference will now be made in detail to preferred embodiments of the disclosure, examples of which are illustrated in the accompanying drawings. Wherever possible, the same reference numbers will be used throughout the drawings to refer to the same or like parts. In the following description of the disclosure, detailed descriptions of known functions and configurations incorporated herein will be omitted when the same can obscure the subject matter of the disclosure. In addition, the names of elements used in the following description are selected in consideration of clarity of description of the specification, and can differ from the names of elements of actual products.

Hereinafter, a light emitting device and a light emitting display device including the same will be described with reference to the annexed drawings. All the components of each light emitting device and a light emitting display device including the same according to all embodiments of the present disclosure are operatively coupled configured.

Figure 2:
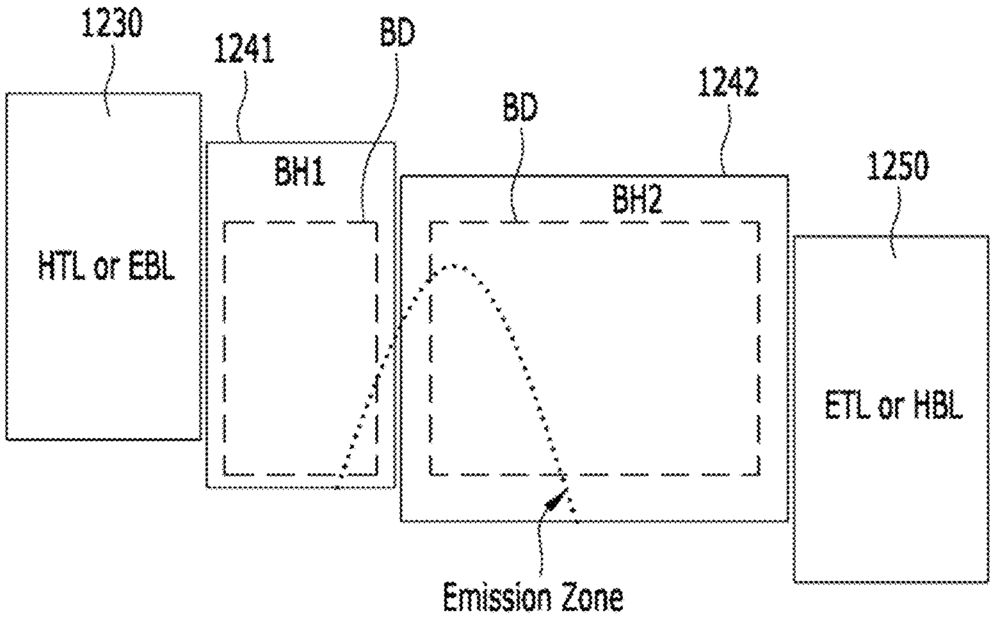
FIG. 2 is an energy band diagram of a blue light-emitting portion and the surrounding layer of FIG. 1.
Figure 3:
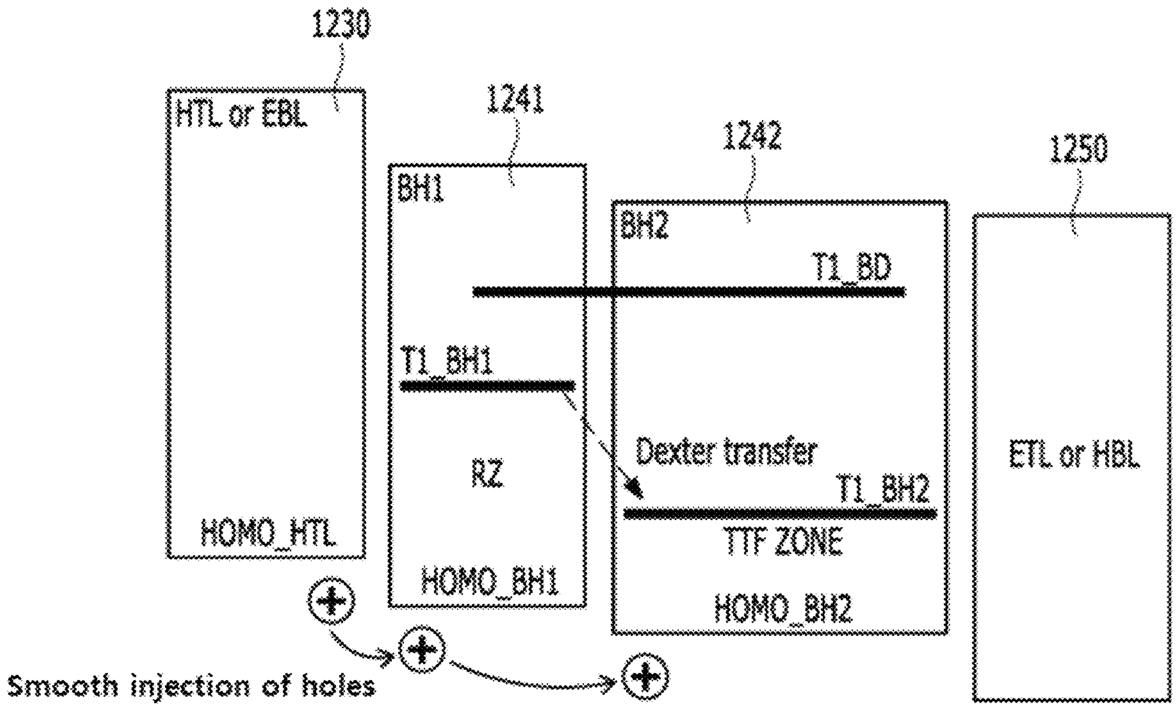
FIG. 3 illustrates a light-emitting area generated in the blue light-emitting portion of FIG. 2.

FIG. 1 is a cross-sectional view schematically illustrating a light emitting device according to a first embodiment of the present disclosure. FIG. 2 is an energy band diagram of a blue light-emitting portion and the surrounding layer of FIG. 1. FIG. 3 illustrates a light-emitting area generated in the blue light-emitting portion of FIG. 2.

As shown in FIG. 1, a light emitting device ED according to the first embodiment of the present disclosure includes a first electrode (e.g., anode) 110 and a second electrode (e.g., cathode) 200 facing each other, and an intermediate layer OS disposed between the first electrode 110 and the second electrode 200. The intermediate layer OS includes a first blue stack BS1, a first charge generation layer CGL1, and a phosphorescent stack PS.

The intermediate layer OS can further include a second charge generation layer CGL2 and a second blue stack BS2 to increase blue efficiency.

The example of the light emitting device shown in FIG. 1 is a white light emitting device which emits white light by combination of light emitted from light-emitting stacks BS1, PS, and BS2 included in the intermediate layer OS. FIG. 1 shows an example in which light is emitted downward. When the first electrode 110 is provided on the substrate, the light emitted from the light emitting device passes through the first electrode 110 and permeates the substrate, which is visible to the naked eye.

The first blue stack BS1 can be disposed between the first electrode 110 and the first charge generation layer CGL1, and can include a first common layer CML1, a first blue light-emitting portion BEML1, and a second common layer CML2. The first common layer CML1 disposed below the first blue light-emitting portion BEML1 can include a hole injection layer and a hole transport layer, and the second common layer CML2 disposed above the first blue light-emitting portion BEML1 can include an electron transport layer.

The hole transport layer can include a plurality of identical or different hole transport layers to facilitate the transport of holes. When the first common layer CML1 includes a plurality of different hole transport layers, the hole transport layer adjacent to the first blue light-emitting portion BEML1 can be an electron (exciton) blocking layer EBL.

In addition, when the second common layer CML2 includes a plurality of layers, the common layer contacting the top surface of the first blue light-emitting portion BEML1 can be an electron transport layer ETL or a hole blocking layer HBL. The phosphorescent stack PS can be disposed between the first charge generation layer CGL1 and the second charge generation layer CGL2, and can include a phosphorescent light-emitting portion PEML including a red light-emitting layer REML, a yellow green light-emitting layer YGEML, and a green light-emitting layer GEML. Further, the phosphorescent stack PS can further include a third common layer CML3 of a hole transport layer below the phosphorescent light-emitting portion PEML, and a fourth common layer CML4 of an electron transport layer above the phosphorescent light-emitting portion PEML.

The phosphorescent light-emitting portion PEML provided in the phosphorescent stack PS can include a plurality of phosphorescent light-emitting layers. The phosphorescent light-emitting portion PEML can include light-emitting layers of a variety of colors having a longer wavelength than blue, thereby providing rich color expression of the light emitting device and improving color reproducibility. The red light-emitting layer REML, the yellow-green light-emitting layer YGEML, and the green light-emitting layer GEML of the phosphorescent light-emitting portion PEML can be disposed so as to contact one another. The red light-emitting layer REML can contact the third common layer CML3 and the green light-emitting layer GEML can contact the fourth common layer CML4.

The second blue stack BS2 can be disposed between the second charge generation layer CGL2 and the second electrode 200 and can include a fifth common layer CML5, a second blue light-emitting portion BEML2, and a sixth common layer CML6. The fifth common layer CML5 disposed below the second blue light-emitting portion BEML2 can include a hole transport layer, and the sixth common layer CML6 disposed above the second blue light-emitting portion BEML2 can include an electron transport layer.

At least one of the first generation layer CGL1 or the second charge generation layer CGL2 can include an n-type charge generation layer and a p-type charge generation layer. The n-type charge generation layer is a layer that generates electrons and supplies the electrons to an adjacent lower stack and the p-type charge generation layer is a layer that generates holes and supplies the holes to an adjacent upper stack. In some cases, the n-type charge generation layer can be used as an alternative to the electron transport layer of the lower stack, and the p-type charge generation layer can be used as an alternative to the hole transport layer of the upper stack.

In some cases, the n-type charge generation layer and the p-type charge generation layer of the first and second charge generation layers CGL1 and CGL2 can be formed as a single layer.

As shown in FIG. 2, at least one of the first or second blue light-emitting portion BEML1 or BEML2 according to an embodiment of the present disclosure has a double-layer structure including a first blue light-emitting layer 1241 including a first host BH1 and a blue dopant BD, and a second blue light-emitting layer 1242 including a second host BH2 and a blue dopant BD.

The first and second hosts BH1 and BH2 differ from each other in the triplet energy level thereof. The triplet energy level of the first host BH1 is greater than the triplet energy level of the second host BH2.

The first blue light-emitting layer 1241 contacts the hole transport layer 1230 or the electron blocking layer EBL and the second blue light-emitting layer 1242 contacts the electron transport layer 1250 or the hole blocking layer HBL.

The first and second blue light-emitting layers 1241 and 1242 commonly include the blue dopant BD.

The triplet levels of the first and second hosts BH1 and BH2 and the blue dopant BD in the blue light-emitting portion have the following relationship. As shown in Table 1 and FIG. 3, the triplet energy level T1_BH1 of the first host BH1 can be greater than the triplet energy level T1_BH2 of the second host BH2 and can be smaller than the triplet energy level T1_BD of the dopant. For example, among the materials included in the first and second blue light-emitting layers 1241 and 1242, the triplet energy level of the blue dopant T1_BD can be the greatest and the triplet energy level of the second host T1_BH2 can be the smallest (T1_BD>T1_BH1>T1_BH2).

The blue dopant BD included in the first blue light-emitting layer 1241 and the second blue light-emitting layer 1242 is a dopant capable of fluorescing. Singlet excitons and triplet excitons are generated at a ratio of about 1:3 through recombination of holes and electrons in the first blue light-emitting layer 1241. The triplet excitons in the first blue light-emitting layer 1241 do not directly fluoresce. However, in the light emitting device according to an embodiment of the present disclosure, as shown in FIG. 3, Dexter energy transfer occurs from the triplet energy level of the second blue light-emitting layer 1242 in contact with the first blue light-emitting layer 1241 to the triplet energy level T1_BH2 of the second host BH2 of the second blue light-emitting layer 1242 having a low triplet energy level, the transferred triplet excitons are converted into excited and ground singlet excitons through triplet-triplet fusion (TTF) mainly in the second blue light-emitting layer 1242, and the excited and ground singlet excitons can be used as a fluorescence light-emitting source in the second blue light-emitting layer 1242. For example, the second blue light-emitting layer 1242 fluoresces by generation of inherent singlet excitons, and fluoresces by singlet excitons generated by the TTF reaction between the triplet excitons generated and transferred from the first blue light-emitting layer 1241 and the triplet excitons generated from the second blue light-emitting layer 1242. Light emission is concentrated in the second blue light-emitting layer 1242 of the blue light-emitting portion. In particular, triplet excitons transferred from the first blue light-emitting layer 1241 to the second blue light-emitting layer 1242 are concentrated at the interface of the first and second blue light-emitting layers 1241 and 1242 during the TTF reaction, so that light emission is concentrated in a region adjacent to the interface of the first and second blue light-emitting layers 1241 and 1242 in the blue light-emitting portion.

As a result, the light emitting device according to an embodiment of the present disclosure can recycle and reuse triplet excitons that have been quenched in the single light-emitting layer structure in the blue light-emitting unit for light emission, thereby improving the blue luminous efficacy. In the first and second blue light-emitting layers 1241 and 1242, light-emitting regions can be formed without limiting to the interface with the hole transport layer 1230 or the interface with the electron transport layer 1250, so that it is possible to solve the problem of lifetime reduction caused by accumulation of excitons or electrons in the adjacent hole transport layer 1230 and electron transport layer 1250.

In the light emitting device according to an embodiment of the present disclosure, the triplet energy level of the blue dopant BD commonly used in the first and second blue light-emitting layers 1241 and 1242 is set to be higher than the triplet energy level of the first and second hosts, so that energy traps caused by excitons do not occur in the dopant.

In the light emitting device according to an embodiment of the present disclosure, light is emitted not only in the first blue light-emitting layer 1241 but also in the second blue light-emitting layer 1242 based on the relationship of T1_BD>T1_BH1>T1_BH2, and more specifically, the triplet excitons of the first blue light-emitting layer 1241 move through Dexter energy transfer to the triplet energy level of the second blue light-emitting layer 1242, thereby increasing the light-emitting intensity of the second blue light-emitting layer 1242 and further increasing the luminous efficacy. In addition, by forming a double blue light-emitting layer structure using different hosts, among the excitons generated in the first blue light-emitting layer, the amount of triplet excitons that were not used for light emission and quenched is reduced and the triplet excitons that were not used for fluorescence are moved to the blue light-emitting layer and converted into singlet excitons to increase the amount of light emitted from the second blue light-emitting layer. Light emission is concentrated in a region close to the second blue light-emitting layer, particularly, the interface between the first and second blue light-emitting layers, so that accumulation of excitons at the interface with the hole transport layer or the electron transport layer can be solved. The light emitting device of the present disclosure can solve the problems such as quenching phenomenon, device deterioration, and lifespan reduction caused by accumulation of excitons generated at the interface of the hole transport layer or the electron transport layer.

For example, the light emitting device of the present disclosure transfers the triplet excitons, which could not be used in well-known light emitting devices having a single light-emitting layer, from the interface between the first and second blue light-emitting layers through Dexter energy transfer based on the difference in triplet energy level between the first and second blue light-emitting layers, thereby reusing the triplet excitons, which were not involved in light emission, through the TTF reaction and increasing energy utilization. Here, the triplet energy level of the blue dopant is set to be higher than the triplet energy level of the first host BH1, to prevent the phenomenon in which excitons are trapped by the blue dopant in the blue light-emitting portion and are not used for light emission.

In addition, the thickness of the first blue light-emitting layer 1241 with respect to the total thickness T of the first and second blue light-emitting layers 1241 and 1242 is set to 0.2 T or more and 0.5 T or less. More preferably, the thickness of the first blue light-emitting layer 1241 is not less than 0.2 and less than 0.5 times the total thickness T of the first and second blue light-emitting layers 1241 and 1242, and the thickness of the blue light-emitting layer 1241 passing triplet excitons is less than ½ of the total thickness T of the first and second blue light-emitting layers 1241 and 1242. For example, the thickness of the second blue light-emitting layer 1242, on which light emission is concentrated, is set to be greater than that of the first blue light-emitting layer 1241, so that light emission is concentrated in the second blue light-emitting layer 1242, and more specifically, light intensity is the greatest at the center or the second blue light-emitting layer 1, or near the interface of the second blue light-emitting layers 1241 and 1242. When, contrary to the aforementioned thickness conditions, the thickness of the first blue light-emitting layer 1241 is 0.5 or more times the total thickness T of the first and second blue light-emitting layers 1241 and 1242, a light-emitting area can be formed adjacent to the electron transport layer 1250 because holes are rapidly transported through the hole transport layer 1230 and the first blue light-emitting layer 1241. This can cause excitons to be accumulated adjacent to the electron transport layer 1250, resulting in an effect of increasing luminous efficacy. Therefore, in order to prevent this phenomenon, the thickness of the first blue light-emitting layer 1241 is preferably defined within the range described above.

Meanwhile, in the light emitting device of the present disclosure, the light-emitting area is concentrated adjacent to the interface of the first and second blue light-emitting layers 1241 and 1242, and the second blue light-emitting layer 1242 has the highest light-emitting intensity. When the light-emitting area is excessively wide, color reproducibility can deteriorate. As shown in FIG. 2, the light-emitting area is concentrated adjacent to the center of the blue light-emitting portion or the interface between the first and second blue light-emitting layers 1241 and 1242.

In the light emitting device according to an embodiment of the present disclosure, the first blue light-emitting layer 1241 is a recombination zone RZ of holes and electrons, and the first host BH1 has a high triplet energy level T1_BH1. Triplet excitons are not directly involved in fluorescence, but triplet excitons generated in the recombination region RZ move to the triplet energy level of the second host BH2 having a low triplet energy level, and can be recycled for fluorescence through the TTF reaction. For example, triplet excitons included in the second blue light-emitting layer 1242 and triplet excitons transferred from the first blue light-emitting layer 1241 collide with each other and are converted into singlet excitons in the ground state and singlet excitons in the excited state (having a higher energy level), so that singlet excitons converted into the second blue light-emitting layer 1242 can be used for fluorescence.

Since the second blue light-emitting layer 1242 has a triplet energy level lower than that of the first host BH1, the triplet excitons generated in the first blue light-emitting layer 1241 are moved to the triplet energy level of the second host BH2 of the second blue light-emitting layer 1242 and are then stabilized. In addition, triplet excitons are highly dense in the second blue light-emitting layer 1242 and thus frequently collide each other, thus facilitating the TTF reaction, forming more singlet excitons contributing to fluorescence, and thus improving luminous efficacy.

When the triplet energy level of the blue dopant is lower than the triplet energy level of the first and second hosts, triplet excitons are trapped at the triplet energy level of the blue dopant. In this case, the TTF can be deteriorated. In the light emitting device of the present disclosure, the triplet energy level of the blue dopant common to the first and second blue light-emitting layers 1241 and 1242 is set higher than the triplet energy level of the first and second hosts.

Meanwhile, the blue light-emitting portion described with reference to FIGS. 2 and 3 can be provided in both the first blue stack and the second blue stack of FIG. 1, can be provided only in the first blue stack, or can be provided only in the second blue stack. In all of these cases, the blue light-emitting portion has the effects of improving blue efficiency and of preventing reduction in lifespan.

In addition, in the light emitting device according to another embodiment of the present disclosure, the blue dopant BD included in the adjacent first and second blue light-emitting layers 1241 and 1242 can include different materials depending on circumstances. Even in this case, preferably, the triplet energy level of the blue dopant is higher than the triplet energy level of the first and second hosts BH1 and BH2 included in the first and second blue light-emitting layers 1241 and 1242, to prevent the triplet excitons from being trapped in the triplet energy level of the blue dopant.

In the light emitting device according to an embodiment of the present disclosure used in the following experiments, the materials of the hole transport layer, the first blue light-emitting layer, and the second blue light-emitting layer have the following relationship between the HOMO energy level and the LUMO (lowest unoccupied molecular orbital) energy levels, and triplet energy as shown in Table 1.

TABLE 1

| | | Physical properties | | |
|---|---|---|---|---|
| Layer | Ingredient | HOMO (eV) | LUMO (eV) | T1(eV) |
| Hole transport layer | Hole transport layer material | −5.8~−5.6 | −2.5~−2.3 | 2.4~2.7 |
| First blue light-emitting layer | BH1 | −6.0~−5.8 | −3.1~−2.9 | 1.6~2.2 |
| | BD | −5.3~−5.1 | −2.5~−2.3 | 2.3~2.7 |
| Second blue light-emitting layer | BH2 | −6.2~−5.9 | −3.1~−2.9 | 1.6~2.0 |
| | BD | −5.3~−5.1 | −2.5~−2.3 | 2.3~2.7 |

As shown in Table 1 and FIGS. 2 and 3, the triplet energy level T1_HTL of the hole transport layer 1230 in the blue stack is set greater than the triplet energy level T1_BH1 of the first host, so that the triplet excitons do not enter the hole transport layer 1230 and are confined to the blue light-emitting portions of the first and second blue light-emitting layers 1241 and 1242.

In addition, the HOMO energy level HOMO_BH1 of the first host is lower than the HOMO energy level HOMO_HTL of the hole transport layer and is equal to or higher than the HOMO energy level HOMO_BH2 of the second host, so that the hole transport layer 1230 can smoothly inject holes to the blue light-emitting portion.

An energy bandgap HOMO_BD-LUMO_BD of the blue dopant BD is adjusted within the respective energy bandgap of the first host BH1 and the second host BH2, so that light emission from the blue dopant occurs stably.

The LUMO energy levels of the first and second hosts BH1 and BH2 can be equal to each other. The first and second hosts BH1 and BH2 are involved in hole transport and triplet exciton transfer. The LUMO energy levels of the first and second hosts BH1 and BH2 in the light emitting device according to an embodiment of the present disclosure can be different from each other. For example, when the LUMO energy level of each of the first and second hosts BH1 and BH2 is higher than that of the blue dopant BD, sequential transfer of holes and transition of triplet excitons in the first and second blue light-emitting layers 1241 and 1242 are not suppressed.

Meanwhile, when the blue light-emitting portion including the first and second blue light-emitting layers having the two-layer structure described above is provided as a blue stack, there are effects of improving the blue luminous efficacy, increasing lifespan and preventing deterioration. In addition, when the blue light-emitting portion is provided in a white light emitting device including a phosphorescent stack along with the blue stack of FIG. 1, structurally, the blue efficiency of the blue light-emitting portion is evenly improved in low and high gradations and the phenomenon in which colors other than blue are prominent when driving at low gradations can be reduced. This will be described later with reference to experiments.

Meanwhile, in FIG. 1, a second vertical distance B1 from the center of the green light-emitting layer to the center of the second blue-light-emitting portion BEML2 of the second blue stack BS2 can be longer than a first vertical distance A1 from the center of the first blue light-emitting portion BEML1 to the center of the green light-emitting layer GEML of the phosphorescent light-emitting portion PEML (A1<B1).

In this case, for example, the first vertical distance A1 can be 80 nm to 105 nm and the second vertical distance B1 can be 130 nm to 166 nm.

In a structural manner, the light emitting device of the present disclosure evenly increases the blue efficiency of the blue light-emitting portion in low and high gradations, and also compensates for the prominence of a specific color by reducing the luminous efficacy and deviation with the light-emitting portion, especially with the green light-emitting portion during driving at low gradation based on the design of the distance between the first blue light-emitting portion, the second blue light-emitting portion, and the green light-emitting layer.

For this purpose, the thickness of the fourth common layer CML4 included in the phosphorescent stack PS is greater than the thickness of the second common layer CML2 included in the first blue stack BS1, or the thickness of the fifth common layer CML5 included in the second blue stack BS2 can be greater than the thickness of the third common layer CML3 included in the phosphorescent stack PS. Alternatively, the thickness of the fourth common layer CML4 included in the phosphorescent stack PS can be greater than the thickness of the second common layer CML2 included in the first blue stack BS1, and at the same time, the thickness of the fifth common layer CML5 included in the second blue stack BS2 can be greater than the thickness of the third common layer CML3 included in the phosphorescent stack PS.

Hereinafter, Examples 1 to 3 of the present disclosure will be described depending on the configuration of the blue light-emitting portion.

Figure 4:
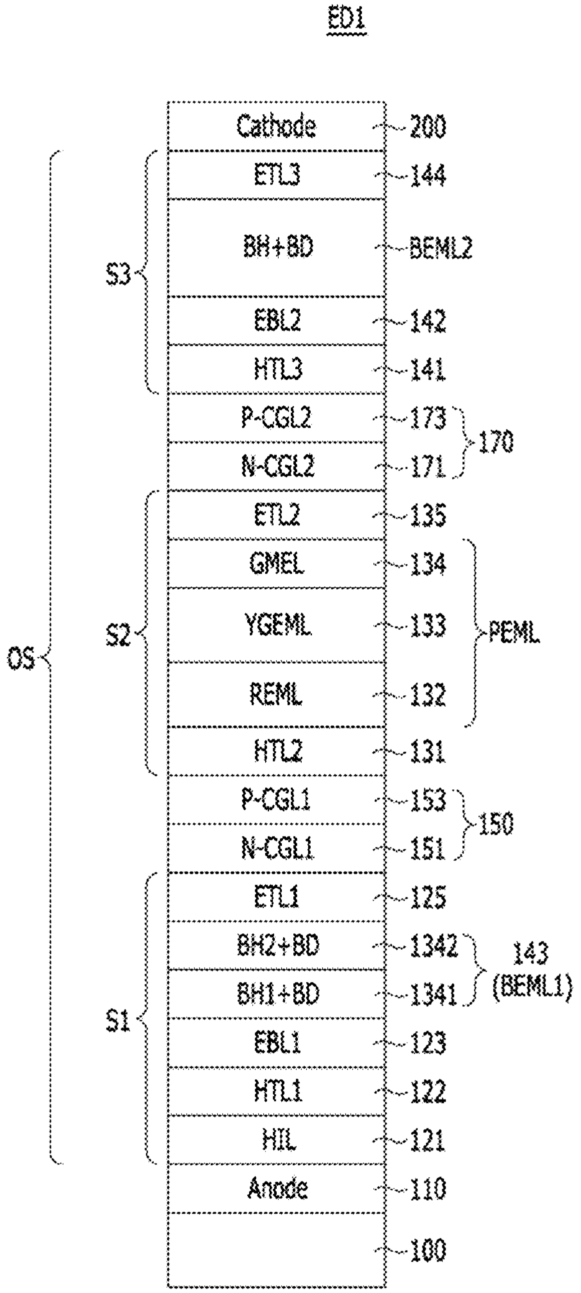
FIG. 4 is a cross-sectional view illustrating a light emitting device according to Example 1 of the present disclosure.

FIG. 4 is a cross-sectional view illustrating a light emitting device according to Example 1 of the present disclosure.

As shown in FIG. 4, a light emitting device ED1 according to Example 1 of the present disclosure includes a first electrode (e.g., anode) 110 and a second electrode (e.g., cathode) 200 facing each other on a substrate 100, and an intermediate layer OS disposed between the first electrode 110 and the second electrode 200. The intermediate layer OS includes a first blue stack S1, a first charge generation layer 150, a phosphorescent stack S2, a second charge generation layer 170 and a second blue stack S3.

The first blue stack S1 includes a hole injection layer 121, a first hole transport layer 122, a first electron blocking layer 123, a first blue light-emitting layer 1341, a second blue light-emitting layer 1342, and an electron transport layer 125 stacked in this order.

As described with reference to FIGS. 2 and 3, in the first blue light-emitting portion BEML1 143 including the first blue light-emitting layer 1341 and the second blue light-emitting layer 1342 stacked in this order, the first blue light-emitting layer 1341 includes a first host BH1 and a blue dopant BD, and the second blue light-emitting layer 1342 includes a second host BH2 and a blue dopant BD. The triplet energy level T1_BH1 of the first host BH1 is greater than the triplet energy level T1_BH2 of the second host (T1_BH1>T1_BH2) and is smaller than the triplet energy level of the dopant (T1_BD>T1_BH1). For example, the relationship of T1_BD>T1_BH1>T1_BH2 is satisfied in the first blue light-emitting portion BEML1 143.

In addition, the phosphorescent stack S2 includes a second hole transport layer 131, a red light-emitting layer 132, a yellow-green light-emitting layer 133, a green light-emitting layer 134, and a second electron transport layer 135 stacked in this order.

The second blue stack S3 includes a third hole transport layer 141, a second electron blocking layer 142, a second blue light-emitting portion BEML2 including a host BH and a blue dopant BD, and a third electron transport layer 144 stacked in this order.

The second blue light-emitting layer BEML2 can include the same dopant as the blue dopant of the first blue light-emitting layers 1341 and 1342 of the first blue stack S1 described above and the host BH can include at least one of the first host BH1 or the second host BH2.

The first and second charge generation layers 150 and 170 can include n-type charge generation layers 151 and 171 and p-type charge generation layers 153 and 173, respectively. In some cases, at least one of the first or second charge generation layer 150 or 170 can be provided in an integral from.

In addition, the n-type charge generation layers 151 and 171 can serve as electron transport layers of the lower stack, and the p-type charge generation layers 153 and 173 can serve as hole transport layers of the upper stack.

Figure 5:
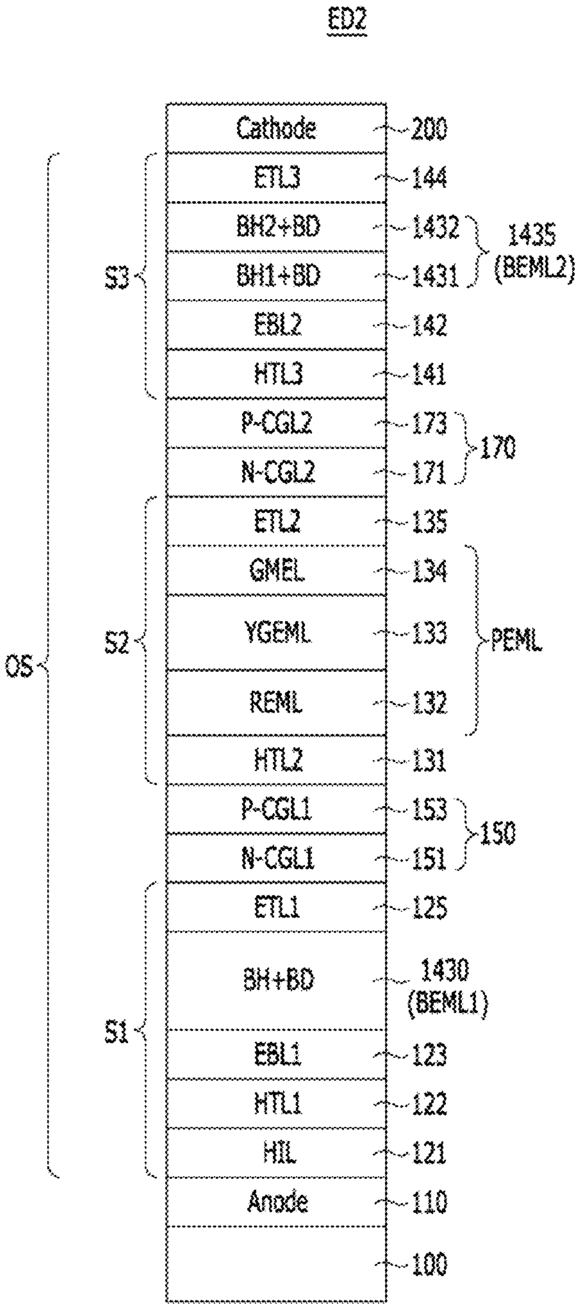
FIG. 5 is a cross-sectional view illustrating a light emitting device according to Example 2 of the present disclosure.

FIG. 5 is a cross-sectional view illustrating a light emitting device according to Example 2 of the present disclosure.

As shown in FIG. 5, a light emitting device ED2 according to Example 2 of the present disclosure is different from the light emitting device ED1 according to Example 1 of the present disclosure in that the first blue light-emitting portion BEML1 (1430) includes a single layer including the host BH and the blue dopant BD, and the second blue light-emitting portion BEML2 (1435) has a double-layer structure including the first blue light-emitting layer 1431 and the second blue light-emitting layer 1432, as described with reference to FIGS. 2 and 3.

For example, the second blue light-emitting portion BEML2 (1435) includes the first blue light-emitting layer 1431 and the second blue light-emitting layer 1432 stacked in this order. As described in FIGS. 2 and 3, the first blue light-emitting layer 1431 include the first host BH1 and the blue dopant BD and the second blue light-emitting layer 1432 includes the second host BH2 and the blue dopant BD. The triplet energy level T1_BH1 of the first host BH1 is greater than the triplet energy level T1_BH2 of the second host (T1_BH1>T1_BH2) and is smaller than the triplet energy level of the dopant (T1_BD>T1_BH1). For example, the relationship of T1_BD>T1_BH1>T1_BH2 is satisfied in the second blue light-emitting portion BEML2 1435.

Figure 6:
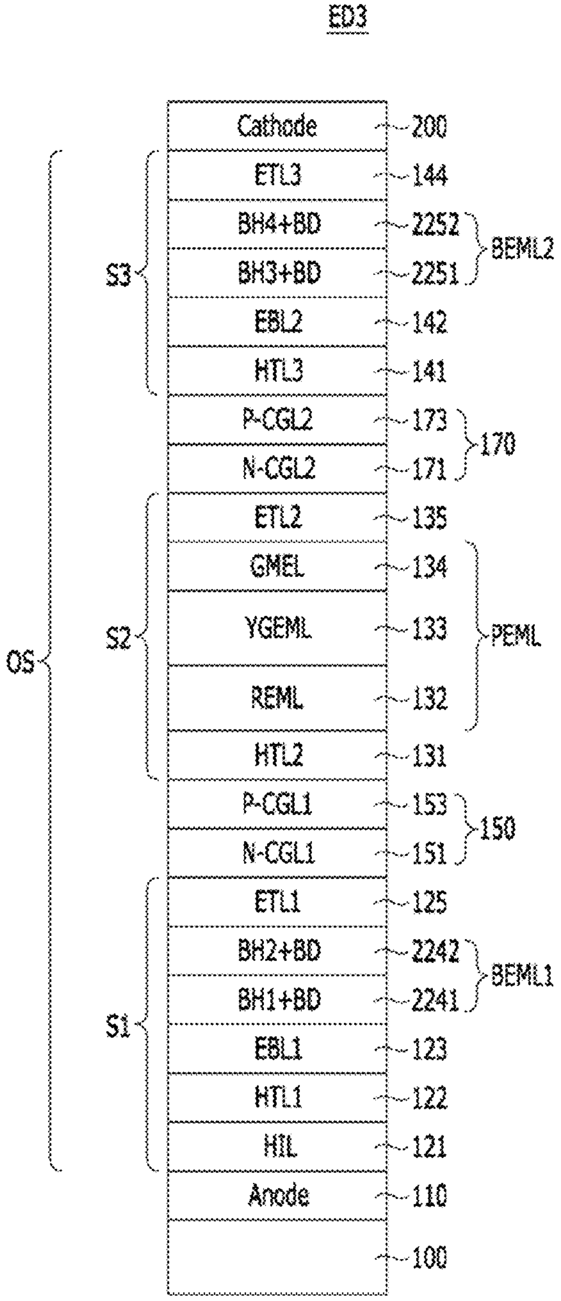
FIG. 6 is a cross-sectional view illustrating a light emitting device according to Example 3 of the present disclosure.

FIG. 6 is a cross-sectional view illustrating a light emitting device according to Example 3 of the present disclosure.

As shown in FIG. 6, a light emitting device ED3 according to Example 3 of the present disclosure includes first and second blue light-emitting portions BEML1 and BEML2 having a two-layer structure in the first and second blue stacks S1 and S3.

For example, the first blue light-emitting portion BEML1 includes the first blue light-emitting layer 2241 and the second blue light-emitting layer 2242 stacked in this order. As described in FIGS. 2 and 3, the first blue light-emitting layer 2241 includes the first host BH1 and the blue dopant BD, and the second blue light-emitting layer 2242 includes the second host BH2 and the blue dopant BD.

In addition, the second blue light-emitting portion BEML2 includes a third blue light-emitting layer 2251 and a fourth blue light-emitting layer 2252 stacked in this order.

As described with reference to FIGS. 2 and 3, the third color light-emitting layer 2251 includes a third host BH3 and a blue dopant BD, and the fourth blue light-emitting layer 2252 includes a fourth host BH4 and a blue dopant BD.

The first blue light-emitting portion BEML1 includes a first blue light-emitting layer 2241 and a second blue light-emitting layer 2242 stacked in this order. As described with reference to FIGS. 2 and 3, the first blue light-emitting layer 2241 includes a first host BH1 and a blue dopant BD, and the second blue light-emitting layer 2242 includes a second host BH2 and the blue dopant BD. The triplet energy level T1_BH1 of the first host BH1 is greater than the triplet energy level T1_BH2 of the second host (T1_BH1>T1_BH2) and is smaller than the triplet energy level of the blue dopant (T1_BD>T1_BH1). For example, the relationship of T1 BD>T1 BH1>T1_BH2 is satisfied in the first blue light-emitting portion BEML1.

In addition, the second blue light-emitting portion BEML2 includes a third blue light-emitting layer 2251 and a fourth blue light-emitting layer 2252 stacked in this order. As described with reference to FIGS. 2 and 3, the third blue light-emitting layer 2251 includes a third host BH3 and the blue dopant BD stacked in this order, and the fourth blue light-emitting layer 2252 includes a fourth host BH4 and the blue dopant BD. The triplet energy level T1_BH3 of the third host BH3 is greater than the triplet energy level T1_BH4 of the fourth host (T1_BH3>T1_BH4) and is smaller than the triplet energy level of the blue dopant (BD) (T1_BD>T1_BH3). For example, the relationship of T1_BD>T1_BH3>T1_BH4 is satisfied in the second blue light-emitting portion BEML2.

The third host BH3 can be the same as the first host BH1 and the fourth host BH4 can be the same as the second host BH2. However, embodiments of the present disclosure are not limited thereto. When the triplet energy level of the third host BH3 is smaller than the triplet energy level of the blue dopant and is greater than the triplet level of the fourth host BH4, although the material for the third host is different from that of the first host, it is possible to increase luminous efficacy due to transfer of triplet excitons from the third blue light-emitting layer 2251 to the fourth blue light-emitting layer 2252 due to the triplet energy level difference described above, and to prevent deterioration in lifespan due to excitons accumulated at the interface of the adjacent hole transport layer or electron transport layer.

Hereinafter, a light emitting display device according to Example 1 of the present disclosure using the light emitting device according to any one of Examples 1 to 3 of the present disclosure will be described.

Figure 7:
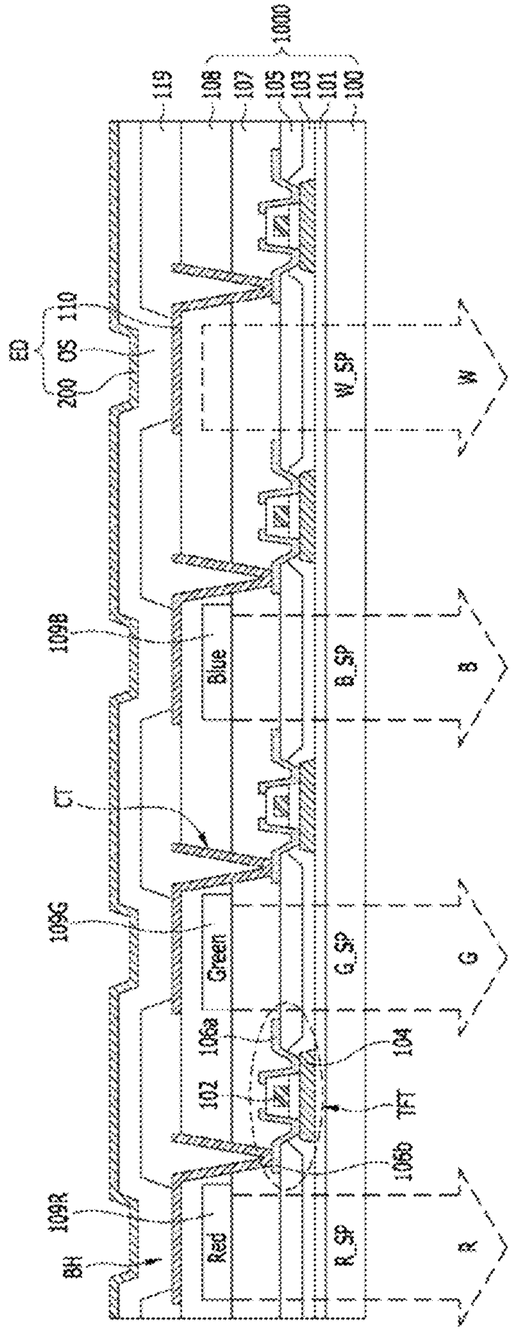
FIG. 7 is a cross-sectional view illustrating a light emitting display device according to Example 1 of the present disclosure.

FIG. 7 is a cross-sectional view illustrating a light emitting display device according to Example 1 of the present disclosure.

As shown in FIG. 7, the light emitting display device according to Example 1 of the present disclosure emits white light through a first electrode 110 on a light-emission side commonly using any one of the first to third light emitting devices to a plurality of sub-pixels R_SP, G_SP, B_SP, and W_SP.

As shown in FIG. 7, the light emitting display device according to Example 1 of the present disclosure includes a substrate 100 having a plurality of sub-pixels R_SP, G_SP, B_SP, and W_SP, a light emitting device ED commonly provided on the substrate 100, a thin film transistor TFT provided in each of the sub-pixels R_SP, G_SP, B_SP, and W_SP and connected to the first electrode 110 of the light emitting device ED, and color filter layers 109R, 109G, and 109B provided below the first electrode 110 in at least one of the sub-pixels.

Although FIG. 7 shows an example in which the light emitting display device includes the white sub-pixel W_SP, the present disclosure is not limited thereto, and the light emitting display device can include the red, green, and blue sub-pixels R_SP, G_SP and B_SP without the white sub-pixel W_SP. In some cases, a combination of a cyan sub-pixel, a magenta sub-pixel, and a yellow sub-pixel capable of representing white is possible instead of red, green and blue sub-pixels.

The thin film transistor TFT includes, for example, a gate electrode 102, a semiconductor layer 104, and a source electrode 106*a* and a drain electrode 106*b* connected to both sides of the semiconductor layer 104. In addition, a channel protection layer can be further provided in an upper portion of the semiconductor layer 104 where the channel is disposed to prevent direct connection between the source/drain electrodes 106*a* and 106*b* and the semiconductor layer 104. The thin film transistor TFT can be disposed on a buffer layer 101 provided on the substrate 100.

A gate insulating layer 103 is provided between the gate electrode 102 and the semiconductor layer 104.

The semiconductor layer 104 can be formed of, for example, oxide semiconductor, amorphous silicon, or polycrystalline silicon, or a combination of two or more thereof. For example, when the semiconductor layer 104 is an oxide semiconductor, the heating temperature required to form the thin film transistor can be lowered, the substrate 100 can be freely used and thus application to a flexible display device is advantageous.

The gate electrode 102 can be provided on the gate insulating layer 103 and an interlayer insulating layer 105 can be further provided between the gate electrode 102 and the source electrode 106*a*/drain electrode 106*b*.

In addition, the drain electrode 106*b* of the thin film transistor TFT can be connected to the first electrode 110 in a contact hole CT provided in first and second passivation layers 107 and 108.

The first passivation layer 107 is primarily provided to protect the thin film transistor TFT, and color filters 109R, 109G, and 109B can be provided on the first passivation layer 107.

The second passivation layer 108 is provided on the first passivation layer 107 including the color filters 109R, 109G, and 109B.

As shown in FIG. 7, when the plurality of sub-pixels includes a red sub-pixel R_SP, a green sub-pixel G_SP, a blue sub-pixel B_SP, and a white sub-pixel W_SP, the color filters are provided as first to third color filters 109R, 109G, and 109B in the sub-pixels R_SP, G_SP, and B_SP, respectively, excluding the white sub-pixel W_SP, to transmit white light emitted through the first electrode 110 at each wavelength. The second passivation layer 108 is formed below the first electrode 110 so as to cover the first to third color filters 109R, 109G, and 109B. The first electrode 110 is formed on the surface of the second passivation film 108 excluding the contact hole CT and is connected to either the drain electrode 106*b* or the source electrode 106*a* of the thin film transistor TFT to receive an electrical signal through the thin film transistor TFT.

Here, a thin film transistor array substrate 1000 includes the substrate 100, the thin film transistor TFT, the color filters 109R, 109G, and 109B, and the first and second passivation films 107 and 108.

The light emitting device ED is formed on the thin film transistor array substrate 1000 including the bank 119 defining a light-emitting portion BH. The organic light-emitting diode (OLED) includes a first electrode 110 as a transparent electrode, a second electrode 200 as a reflective electrode facing the first electrode 110, and a hole transport layer 1230, a first blue light-emitting layer 1241 including a first host BH1 and a blue dopant BD, a second blue light-emitting layer 1242 including a second host BH2 and a blue dopant BD, and an electron transport layer 1250, between at least one of first and third blue stacks S1 and S3, among stacks divided into the first and second charge generation layers CGL1 and CGL2, between the first electrode 110 and the second electrode 200, as shown in FIGS. 1 to 6.

The triplet energy levels of the first host BH1, the second host BH2, and the blue dopant BD have the following relationship of T1_BD>T1_BH1>T1_BH2. The first triplet excitons of the blue light-emitting layers 1241 and 1242 move through Dexter energy transfer to the triplet energy level of the second blue light-emitting layer 1242, so that singlet excitons are generated through the TTF reaction, and light emission is concentrated in the second blue light-emitting layer 1242. In particular, light-emitting intensity increases at the interface between the first and second blue light-emitting layers 1241 and 1242, and accumulation of excitons at the interface between the hole transport layer 1230 and the electron transport layer 1250 can be prevented and thus a decrease in lifespan can be prevented.

The first electrode 110 is divided by each sub-pixel and the layers excluding the first electrode 110 of the light emitting device ED can be integrated throughout the active area regardless of sub-pixel.

Hereinafter, the characteristics and effects of Experimental Example 8 (Ex8), in which the entirety of the blue light-emitting portion of FIG. 1 is a single blue light-emitting layer, as shown in Experimental Example 1 (Ex1) and FIG. 4, in which the first and second blue light-emitting layers in the first blue light-emitting portion BEML1 have different hosts, and the ratio of the thickness of the first blue light-emitting layer 1341 to the total thickness T of the first blue light-emitting portion BEML1 is changed, as shown in Experimental Examples 2 to 7 Ex2 to Ex7 and FIG. 5, and in which different hosts are provided for the first and second blue light-emitting layers of the second blue light-emitting portion BEML2 and the ratio of the thickness of the first blue light-emitting layer 1431 to the total thickness T of the second blue light-emitting portion BEML2 is 0.33 will be described.

TABLE 2

| | Example 1 (FIG. 4) | | | | | | | Example 2 (FIG. 5) |
|---|---|---|---|---|---|---|---|---|
| Characteristics | Ex1 | Ex2 (0.1T) | Ex3 (0.2T) | Ex4 (0.3T) | Ex5 (0.4T) | Ex6 (0.5T) | Ex7 (0.6T) | Ex8 (0.33T) |
| Blue efficiency (0.25 J/5 J) | 93% | 93% | 101% | 102% | 102% | 102% | 100% | 98% |
| Blue efficiency (20 J/5 J) | 97% | 86% | 96% | 96% | 96% | 96% | 97% | 96% |
| ΔWx (0.25 J − 5 J) | 0.014 | 0.013 | 0.005 | 0.004 | 0.004 | 0.004 | 0.006 | 0.008 |
| ΔWy (0.25 J − 5 J) | 0.044 | 0.044 | 0.023 | 0.021 | 0.021 | 0.024 | 0.025 | 0.028 |
| Blue Index | 100% | 99% | 108% | 109% | 108% | 107% | 99% | 106% |
| Lifespan (L95) | 100% | 100% | 107% | 111% | 105% | 104% | 104% | 107% |

In the light emitting device and light emitting display device of the present disclosure, the blue light-emitting portion is formed as a double layer structure, a first host having a high triplet energy level is used in a first blue light-emitting layer close to the hole transport layer in the blue light-emitting portion, and a second host having a lower triplet energy level than the first host is used in a second blue light-emitting layer close to the electron transport layer. As a result, the triplet excitons in the triplet energy level of the first blue light-emitting layer undergo Dexter-energy transfer to the triplet energy level of the second blue light-emitting layer, are combined with the triplet excitons by TTF (triplet-triplet fusion), and then are converted into singlet excitons that can be used for light emission to improve the luminous efficacy. In addition, the light emitting device and the light emitting display device of the present disclosure have different hosts having different triplet levels in the blue light-emitting layer having a two-layer structure, thereby concentrating a light-emitting area in the second blue light-emitting layer, at the interface between the first and second blue light-emitting layers and solving the problem of lifespan reduction caused by accumulation of excitons at the interface between the hole transport layer and the blue light-emitting portion.

In addition, the light emitting device and the light emitting display device of the present disclosure improve the efficiency of the blue light-emitting layer by mitigating the visual sensation of green, which is prominent during low gradation driving in a white light emitting device including a phosphorescent light-emitting layer of color other than blue, thereby preventing abnormality upon representation of white at low gradation.

Figure 8:
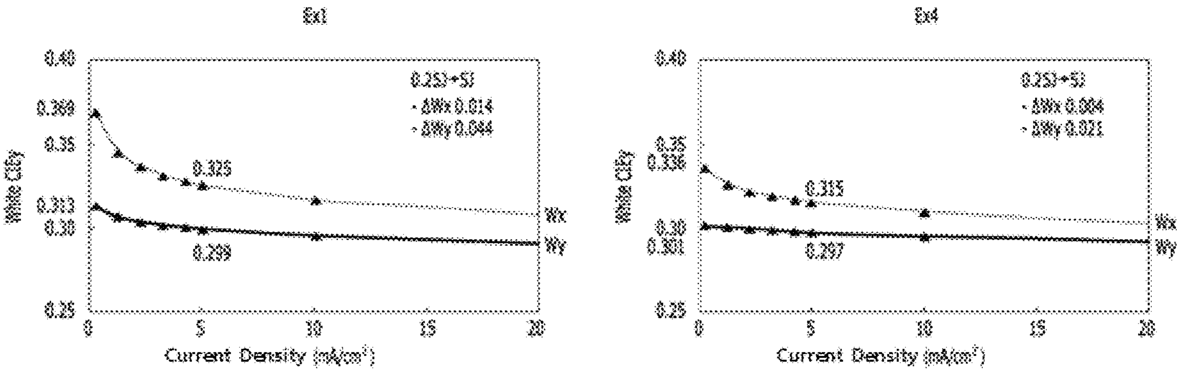
FIG. 8 shows graphs showing white color coordinate characteristics of Experimental Example 1 and Experimental Example 4 of the present disclosure.
Figure 9:
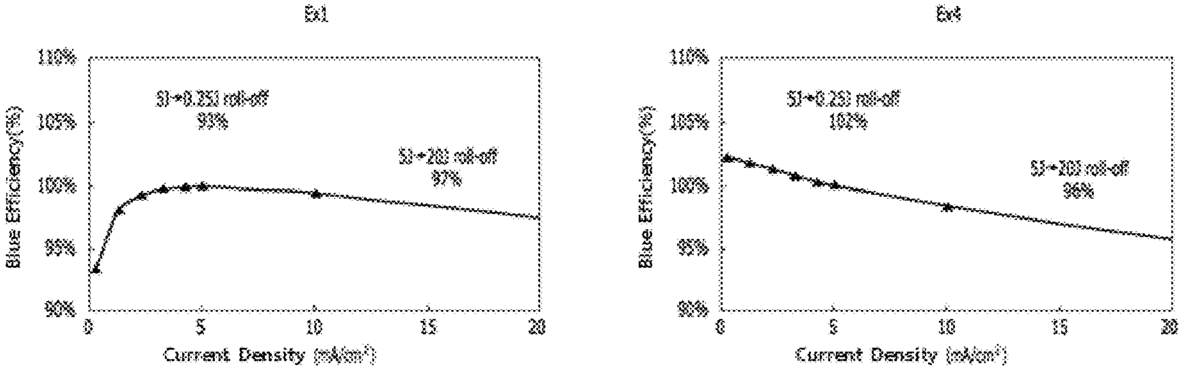
FIG. 9 shows graphs showing the blue efficiency characteristics of Experimental Example 1 and Experimental Example 4 of the present disclosure.

FIG. 8 is a graph showing white color coordinate characteristics of Experimental Examples 1 and 4 of the present disclosure, and FIG. 9 is a graph showing the blue efficiency characteristics of Experimental Examples 1 and 4 of the present disclosure.

As shown in Experimental Example 1 (Ex1) in which the first blue light-emitting portion BEML1 has a single layer structure, and in FIG. 4 of the structure provided with the first and second blue light-emitting layers having different hosts, it can be seen from Table 2 and FIG. 9 that the blue efficiency is remarkably improved at least in a current density change of 0 mA/cm$^2$ to 5 mA/cm$^2$.

In Table 2, 0.25 J is 0.25 mA/cm$^2$, 5 J is 5 mA/cm$^2$, and 20 J is 20 mA/cm$^2$.

As shown in Table 2, when the blue efficiency at the current density of 5 mA/cm$^2$ of Experimental Example 1 (Ex1) is 100%, the blue efficiency at the current density of 0.25 mA/cm$^2$ is 93%, but Experimental Example 2 (Ex2) to Experimental Example 7 (Ex7), in which the thickness of the first blue light-emitting layer 1241 is increased from 0.1 times to 0.6 times the total thickness (T) of the first and second blue light-emitting layers 1241 and 1242, as in Example 1 (FIG. 4), exhibited blue efficiencies of 93%, 101%, 102%, 102%, 102%, and 100% at a current density of 0.25 mA/cm$^2$. For example, when the thickness of the first blue light-emitting layer 1241 is 0.2 times or more the total thickness of the first and second blue light-emitting layers, the blue efficiency at a low current density of 0.25 mA/cm$^2$ is equal to or higher than the blue efficiency at a current density of 5 mA/cm$^2$.

In addition, as in Example 2 (FIG. 5), Experimental Example 8 (Ex8) in which the two-layered blue light-emitting layers 1431 and 1432 are applied to the second blue light-emitting portion BEML2 exhibited a blue efficiency at a low current density of 0.25 mA/cm$^2$ which corresponds to 98% of blue efficiency at a current density of 5 mA/cm$^2$, which indicates that Experimental Example (Ex8) greatly improved efficiency at a low current density compared to Experimental Example 1 (Ex1) having a single layer structure.

As shown in Table 2, when the blue efficiency at the current density of 5 mA/cm$^2$ of Experimental Example 1 (Ex1) is 100%, the blue efficiency at the current density of 20 mA/cm$^2$ is 97%. Experimental Example 2 (Ex2) to Experimental Example 8 (Ex8) exhibited blue efficiency at the current density of 20 mA/cm$^2$ which corresponds to 97% or 96% of blue efficiency at a current density of 5 mA/cm$^2$. This indicates that Experimental Example 2 (Ex2) to Experimental Example 8 (Ex8) exhibited similar change in blue efficiency to Experimental Example 1 (Ex1) when a current density of 5 mA/cm$^2$ is changed to a current density of 20 mA/cm$^2$.

In particular, as can be seen from FIG. 9, in Experimental Example 1 (Ex1), the blue efficiency increases rapidly at a current density of 0.25 mA/cm$^2$ to 5 mA/cm$^2$, the blue efficiency slowly decreases at a current density of 5 mA/cm$^2$ to 20 mA/cm$^2$, and the blue efficiency is the highest at a current density of 5 mA/cm$^2$.

On the other hand, as can be seen from FIG. 9, when the blue efficiency at a current density of 5 mA/cm$^2$ is 100% in Experimental Example 4 (Ex4), the blue efficiency at a current density of 0.25 mA/cm$^2$ is 102% and blue efficiency is rather high at a low current density of 0.2 mA/cm$^2$. For example, it can be seen that when the blue light-emitting portion is formed as a double-layer structure using different hosts, as in the light emitting device of the present disclosure, the blue efficiency changes sequentially from low current density to high current density, and in particular, the increase in blue efficiency at a low current density is great.

As described above, a specific color is prominent when driving at a low current density when white is expressed in a light emitting device having a tandem structure designed at a high current density.

This can be due to the deviation of the white color coordinates when the current density changes from 0.25 J (mA/cm$^2$) to 5 J (mA/cm$^2$) in Table 1.

In Experimental Example 1 (Ex1), the X color coordinate change (ΔWx) of white is 0.014 and the Y color coordinate change (ΔWy) of white is 0.044.

Similar to Experimental Example 1 (Ex1), in Experimental Example 2 (Ex2), in which the thickness of the first blue light-emitting layer 1241 is 0.1 times the total thickness of the first blue light-emitting portion, the X color coordinate change (ΔWx) of white is 0.013 and the Y color coordinate change (ΔWy) of white is 0.044.

Meanwhile, unlike Experimental Examples 1 and 2 (Ex1, Ex2), in Experimental Example 3 (Ex3) to Experimental Example 7 (Ex7), in which the thickness of the first blue light-emitting layer 1241 is 0.2 to 0.6 times the total thickness of the first blue light-emitting portion, as shown in Table 2 and FIG. 8, the X color coordinate change (ΔWx) of white is 0.004 to 0.006, and the Y color coordinate change (ΔWy) of white is 0.021 to 0.025, which indicates that color deviation in current density change remarkably decreases.

For example, when the first and second blue light-emitting layers having different triplet energy levels are provided in the blue light-emitting portion, as in the light emitting device of the present disclosure, the color deviation between blue and other colors is reduced even when the blue light-emitting portion is driven at low gradation, thereby preventing the phenomenon in which a specific color is prominent when white is implemented even in the change at low-gradation current density of 0.25 mA/cm$^2$ to 5 mA/cm$^2$.

In Experimental Example 8 (Ex8) in which the two blue light-emitting layers are applied to the second blue light-emitting portion, unlike Experimental Example 1 (Ex1), the X color coordinate change of white (ΔWx) is 0.008 and the Y color coordinate change of white (ΔWy) is 0.028, which indicates that the color deviation in the current density change is greatly reduced compared to Experimental Example 1 (Ex1).

In addition, the blue indexes obtained by dividing the blue efficiency by the Y color coordinate upon blue light emission for Experimental Examples 1 to 8 (Ex1 to Ex8) were 100%, 99%, 108%, 109%, 108%, 107%, 99%, and 106%, which indicates an increase in blue efficiency. Experimental Example 3 (Ex3) to Experimental Example 7 (Ex6) and Experimental Example 8 (Ex8) have high blue efficiency while maintaining a low Y color coordinate value. For example, it can be seen that the pure blue color is maintained and the blue efficiency is improved when the thickness of the first blue light-emitting layer 1241 is 0.2 to 0.5 times the total thickness of the first blue light-emitting portion.

The lifespan (L95) in Table 2 is the time taken until the luminance changes to 95% the initial luminance when driven at a current density of 40 mA/cm$^2$ at 40° C. In contrast, it can be seen that the lifespan is improved in Experimental Examples 3 to 8 (Ex3 to Ex8), compared to Experimental Example 1 (Ex1).

For example, overall, when the blue light-emitting portion of the present disclosure is used as a two-layer structure of the first and second blue light-emitting layers having different host triplet energy levels, the thickness of the first blue light-emitting layer in contact with the hole transport layer or the electron blocking layer is set 0.2 to 0.5 times the total thickness of the blue light-emitting portion, it is possible to improve the blue efficiency at the low-gradation current density of 0.25 mA/cm$^2$ to 5 mA/cm$^2$, reduce the change in white color coordinates, and improve the blue efficiency in the blue light-emitting portion as well as the lifespan.

Meanwhile, the light emitting device and the light emitting display device according to the present disclosure having improved blue efficiency at a low gradation current density prevent or mitigate the phenomenon in which a specific color is prominent when white is implemented.

The light emitting device and the light-emitting device display of the present disclosure can increase low gradation efficiency, thus providing low power consumption and reduced power consumption. In addition, this can be realized by dividing the areas of the light-emitting layers and the division of the host of the first and second blue light-emitting layers is possible by adjusting the internal end group when designing the host without adding materials. The light emitting device and the light-emitting display device of the present disclosure have an ESG (environmental/social/governance) effect based on the advantages of eco-friendliness, low power consumption, and process optimization.

Hereinafter, a light emitting device according to another embodiment of the present disclosure will be described.

Figure 10:
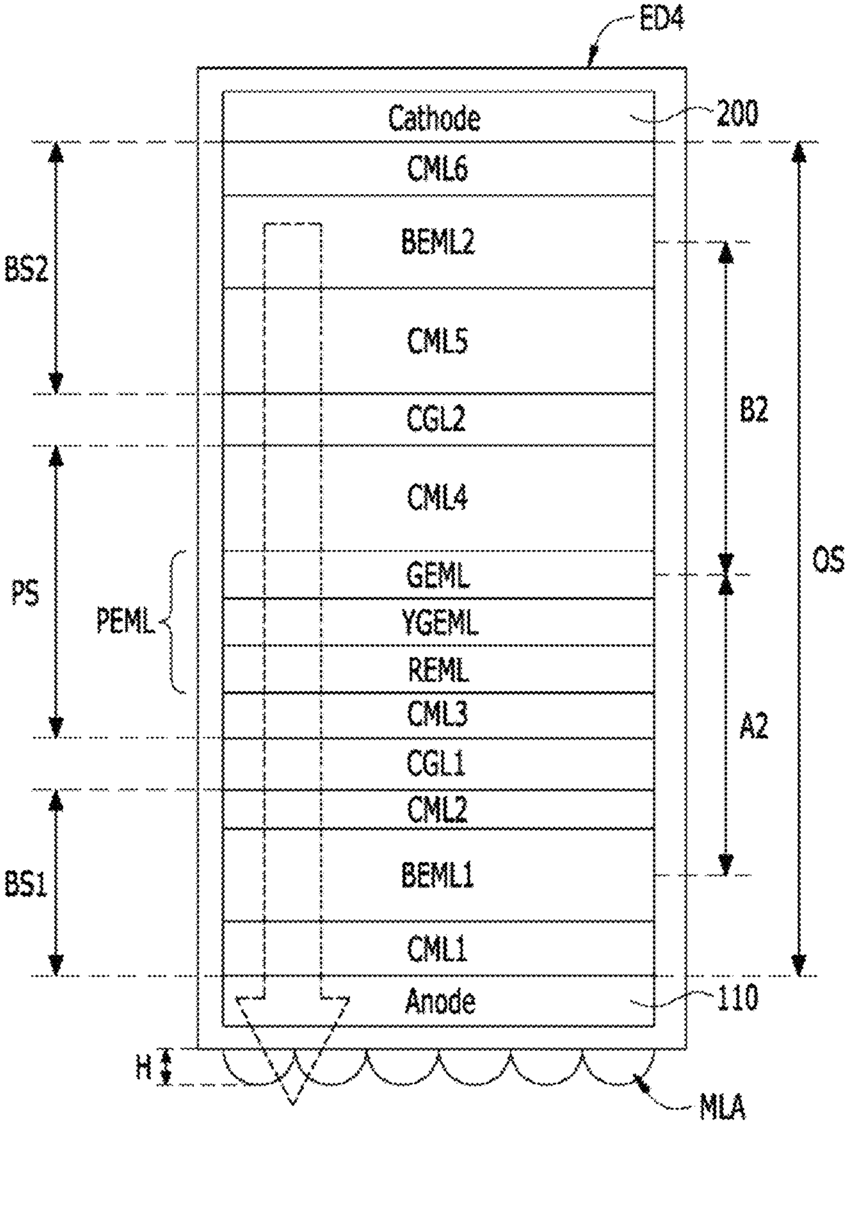
FIG. 10 is a cross-sectional view illustrating a light emitting device according to a second embodiment of the present disclosure.
Figure 11:
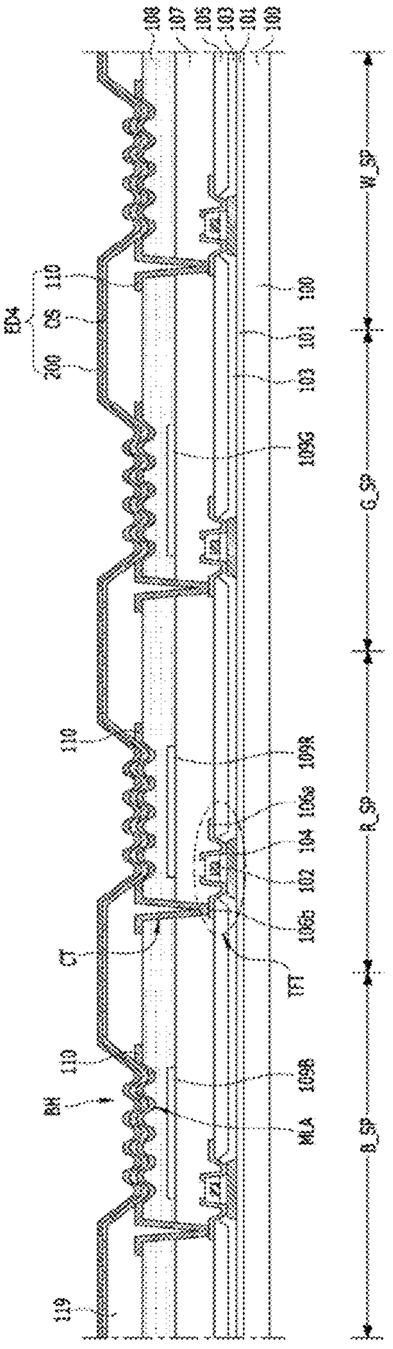
FIG. 11 is a cross-sectional view illustrating a light emitting display device according to the second embodiment of the present disclosure.

FIG. 10 is a cross-sectional view illustrating a light emitting device according to a second embodiment of the present disclosure, and FIG. 11 is a cross-sectional view illustrating a light emitting display device according to Example 2 of the present disclosure.

As shown in FIG. 10, a light emitting device ED4 according to the second embodiment of the present disclosure can include a microlens array MLA having a curved portion below the first electrode 110. Although the microlens array (MLA) shown in FIG. 10 is schematically shown, the height difference (H) between the highest point and the lowest point of the curve can be about 0.1 μm to about 2 μm, and the height difference (H) between the highest point and the lowest point of the curve of each of the first electrode 110 and the second electrode 200 is greater than that the height difference (H) between the highest point and the lowest point of curvature of each layer included in the intermediate layer OS. Accordingly, the first electrode 110 formed on the microlens array MLA, each layer of the intermediate layer OS, and the second electrode 200 can be formed along the curvature of the microlens array MLA provided below the first electrode 110.

The internal stack structure of the light emitting device ED4 in the second embodiment of the present disclosure can be the same as shown in FIG. 1 and descriptions of the same parts are thus omitted.

FIG. 11 illustrates a light emitting display device according to Example 2 of the present disclosure having a configuration in which the light emitting device ED4 of FIG. 10 is included, the curve of the microlens array are provided on the surface of the second protective film 108, and the light emitting device ED4 is provided on the second protective film 108.

As shown in FIGS. 10 and 11, the intermediate layer OS is disposed between the first electrode and the second electrode, and includes the first blue stack BS1, the first charge generation layer CGL1, the phosphorescent stack PS, the charge generation layer CGL2 and the second blue stack BS2. As shown in FIGS. 2 to 3 and FIGS. 4 to 6, at least one of the first blue light-emitting portion BEML1 or the second blue light-emitting portion BEML2 includes first and second blue light-emitting layers 1241 and 1242 respectively provided with a first host BH1 and a second host BH2 having different triplet energy levels. In addition, the triplet energy level of the blue dopant common to the first and second blue light-emitting layers 1241 and 1242 is greater than each of the triplet energy levels of the first and second hosts BH1 and BH2.

The configurations not described with respect to FIGS. 10 and 11 are the same as the configurations described with respect to FIGS. 1 and 7 above.

When the blue light-emitting portion including the first and second blue light-emitting layers of the two-layer structure described above is provided in the blue stack, there are effects of improving blue luminous efficacy, increasing lifespan, and preventing deterioration of the device. In addition, when the blue light-emitting portion is provided in a white light-emitting device including a phosphorescent stack along with the blue stacks BS1 and BS2 of FIG. 10, the blue efficiency of the blue light-emitting portion is improved evenly in low and high gradations and thus the phenomenon in which colors other than blue are relatively prominent in when driving at low gradations can be prevented.

Effects of the light emitting device formed on the flat passivation film have been described with reference to Table 2 and FIGS. 8 and 9, and effects of the structure including the microlens array will be described later.

Meanwhile, when the microlens array MLA is provided below the light emitting device ED, the intermediate layer OS is easily deposited close to the lowest point of the deposition curve, but the thickness of the intermediate layer OS deposited close to the highest point of the curve decreases. For this reason, the thickness of the intermediate layer is set corresponding to the edge of each curve in order to realize sufficient light emission even at the highest point of the curve. Therefore, in the light emitting device ED4 according to the second embodiment, the entire thickness of the intermediate layer OS can be greater than that of the light emitting device ED according to the first embodiment.

In the light emitting device ED4 according to the second embodiment of the present disclosure according to FIGS. 10 and 11, at least one blue light-emitting portion of the blue stack includes a blue light-emitting layer having a double-layer structure having a triplet level difference between hosts, and in order to maximally reflect the structurally compensated increase in blue luminous efficacy to light emission, the second vertical distance B2 from the center of the green light-emitting layer GEML to the center of the second blue light-emitting portion BEML2 of the second blue stack BS2 can be greater than the first vertical distance A2 from the center of the first blue light-emitting portion BEML1 to the center of the green light-emitting layer GEML of the phosphorescent light-emitting portion PEML (A2<B2).

In this case, for example, the first vertical distance A2 can be 130 nm to 160 nm, and the second vertical distance B2 can be 170 nm to 230 nm.

The light emitting device according to the second embodiment of the present disclosure includes a microlens array below the light emitting device ED4 and reduces the prominence of the specific color by reducing the luminous efficacy and deviation from other color light-emitting portion, particularly from the green light-emitting portion, during low gradation driving, by controlling the design of the distance between the first blue light-emitting layer, the second blue light-emitting layer, and the green light-emitting layer based on the improved luminous efficacy for each color caused by the provision of the microlens array. At least one of the first blue light-emitting portion BEML1 or the second blue light-emitting portion BEML2 includes the two blue light-emitting layers shown in FIGS. 2 and 3, which uniformly increase the blue efficacy in low and high gradations.

Figure 12:
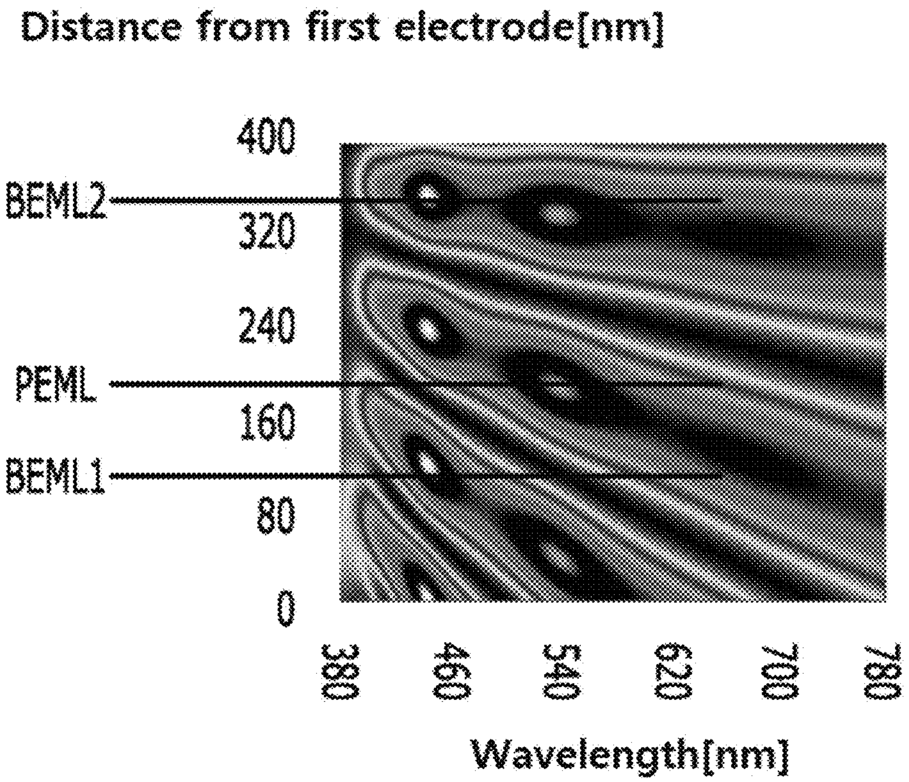
FIG. 12 is a contour map of the light emitting device according to the first embodiment of the present disclosure.
Figure 13:
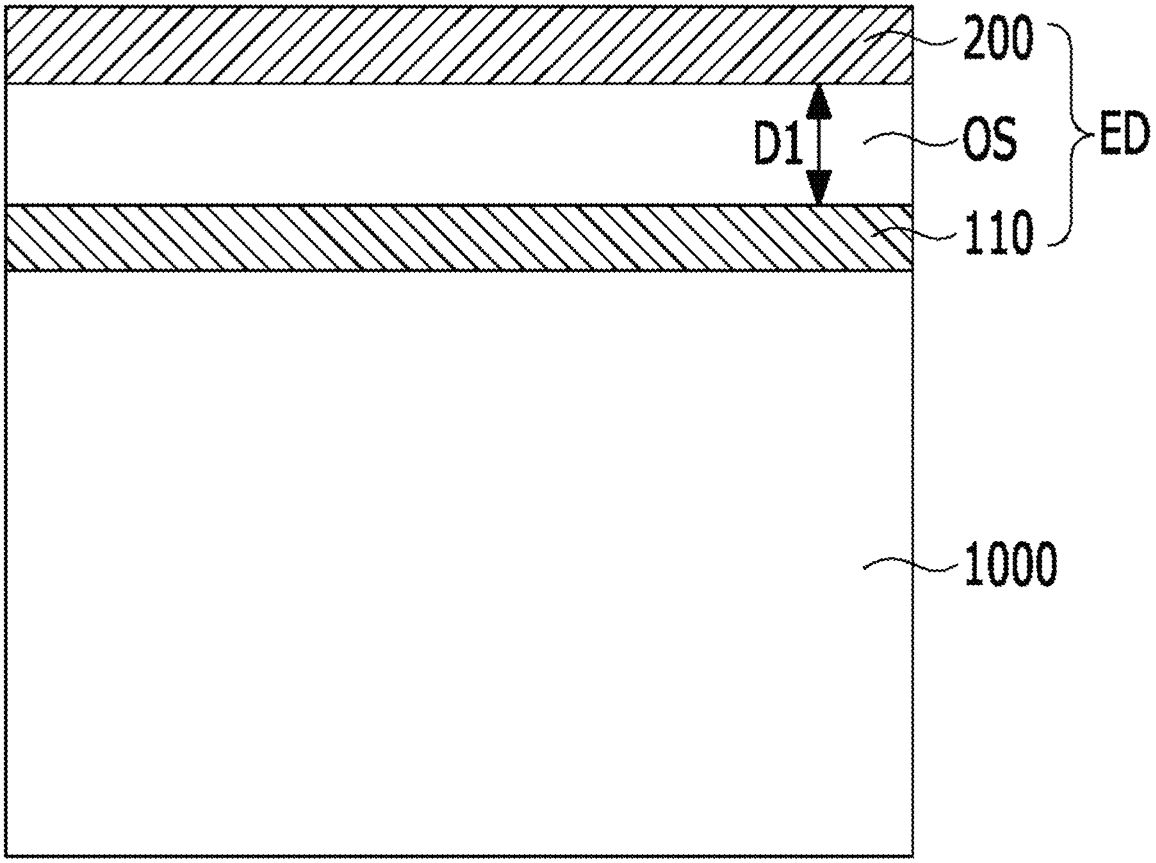
FIG. 13 shows a vertical distance of an intermediate layer of the light emitting device according to the first embodiment of the present disclosure.

FIG. 12 is a contour map of the light emitting device according to the first embodiment of the present disclosure. FIG. 13 shows the vertical distance of the intermediate layer of the light emitting device according to the first embodiment of the present disclosure.

The contour map of the light emitting device according to the first embodiment of the present disclosure of FIG. 1 can be seen from FIG. 12. Here, the horizontal axis of FIG. 12 represents the wavelength, and the vertical axis represents the distance from the first electrode. FIG. 13 shows that the light emitting device ED of FIG. 1 is formed on the thin film transistor array substrate 1000 and the intermediate layer OS is formed as a single structure between the first electrode 110 and the second electrode 200. As shown in FIGS. 1 and 7, FIG. 12 shows the center of the first and second blue light-emitting portions BEML1 and BEML2 and the center of the phosphorescent light-emitting portion PEML.

Here, as shown in FIG. 13, in the light-emitting device ED formed on the flat thin film transistor array substrate 1000, the thickness of the intermediate layer OS has a uniform first thickness D1.

As shown in FIG. 12, the light emission center of the first blue light-emitting portion BEML1 is formed at a vertical distance of 80 nm to 130 nm from the upper surface of the first electrode, and the center of the phosphorescent light-emitting portion PEML is formed at a vertical distance of 160 nm to 230 nm from the upper surface of the first electrode. In addition, the light emission center of the second blue light-emitting portion BEML2 is formed at a vertical distance of 320 nm to 380 nm from the upper surface of the first electrode.

As shown in FIG. 12, the second vertical distance (B1 in FIG. 1) from the center of the phosphorescent light-emitting portion PEML to the center of the second blue light-emitting portion is greater than the first vertical distance (A1 in FIG. 1) from the center of the first blue light-emitting portion to the center of the phosphorescent light-emitting portion.

Figure 14:
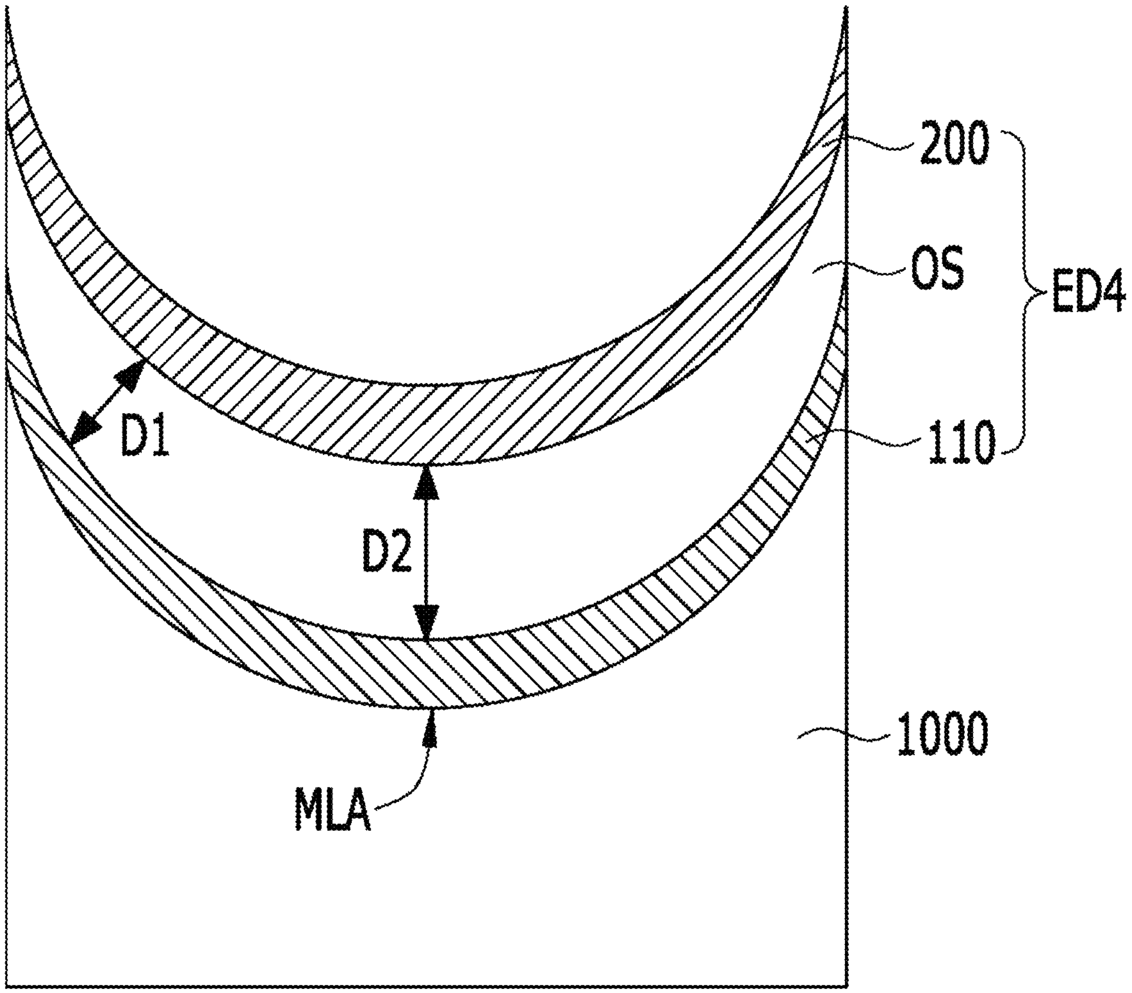
FIG. 14 shows a vertical distance of the intermediate layer of the light emitting device according to the second embodiment of the present disclosure.

FIG. 14 shows a vertical distance of the intermediate layer of the light emitting device according to the second embodiment of the present disclosure.

As shown in FIG. 14, the light emitting device ED4 according to the second embodiment of the present disclosure is formed along the curve of the microlens array MLA disposed on the uppermost surface of the thin film transistor array substrate 1000. For example, when the first electrode 110, the intermediate layer OS, and the second electrode 200 are sequentially formed, each layer can be formed along the curve of the lower microlens array MLA.

In this case, the material is well deposited in a depressed portion, which is the center of the curve, but is deposited thinner at the side of the curve. Therefore, in the same deposition process, the thickness D2 of the intermediate layer OS stacked at the center of the curve is different from the thickness D1 of the intermediate layer OS stacked at the side of the curve.

The light emitting device according to the second embodiment of the present disclosure serves to provide a light-emitting effect even at the curved side. In order to obtain the white light-emitting effect based on the light-emitting layer arrangement of FIG. 12 even on the curved side, the thickness D1 of the intermediate layer OS is set on the curved side. Therefore, compared to the light emitting device ED formed on the flat thin film transistor array substrate of FIG. 13, the thickness of D2 of intermediate layer OS corresponding to the center of the curved portion of the light emitting device ED4 formed on the thin film transistor array substrate having a curved portion in FIG. 14 can be 1.2 to 1.45 times greater than the thickness D1 of the intermediate layer OS disposed at the curved side.

Figure 15:
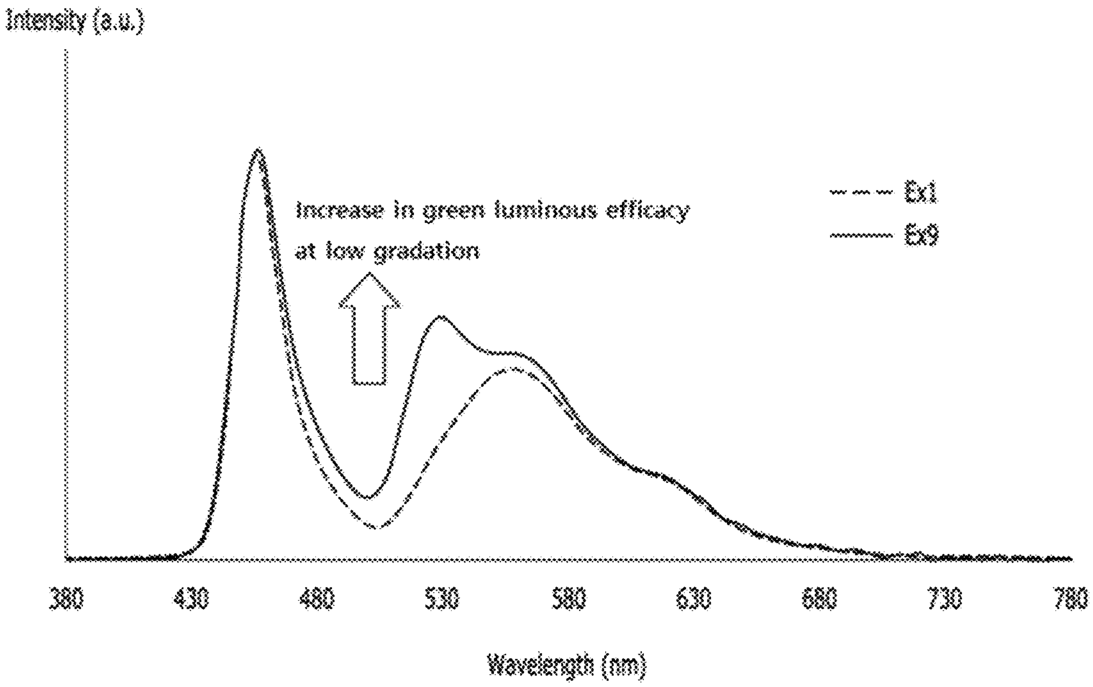
FIG. 15 is a graph showing the spectra of the light emitting devices of Experimental Example 1 and Experimental Example 9 of the present disclosure.

FIG. 15 is a graph showing the spectra of the light emitting devices of Experimental Example 1 and Experimental Example 9 of the present disclosure.

FIG. 15 shows white spectra upon driving at a low gradation of 0.25 $mA/cm^2$ of Experimental Example 1 (Ex1) provided with a flat microlens array in the lower part of the light emitting device and Experimental Example 9 (Ex9) in which a curved microlens array was applied to the lower part of the light emitting device to the structure shown in FIG. 1 in which all of the blue light-emitting portions of the first and second blue stacks BS1 and BS2 have a single blue light-emitting layer.

As shown in FIG. 15, Experimental Example 9 (Ex9) in which the curve of the microlens array is applied to the lower part of the light emitting device has an effect of increasing the luminous intensity, in particular, at 460 nm to 600 nm, and greatly increases the luminous efficacy in the green wavelength range of 500 nm to 570 nm. FIG. 15 shows a greenish phenomenon on the screen upon driving of white light in a low gradation of 0.25 $mA/cm^2$.

In the second embodiment of the present disclosure, even when the first and second blue light-emitting layers having a two-layer structure are applied to at least one of the blue stacks, and the light emitting device is provided on the upper part having the curve of the microlens array, blue color is obtained at low gradation.

Figure 16:
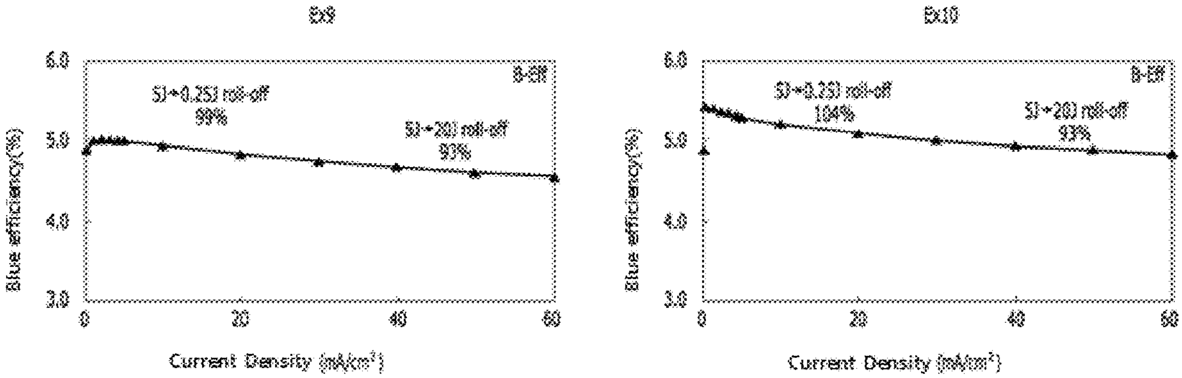
FIG. 16 is a graph showing blue efficiency as a function of current density in Experimental Examples 9 and 10 of the present disclosure.
Figure 17:
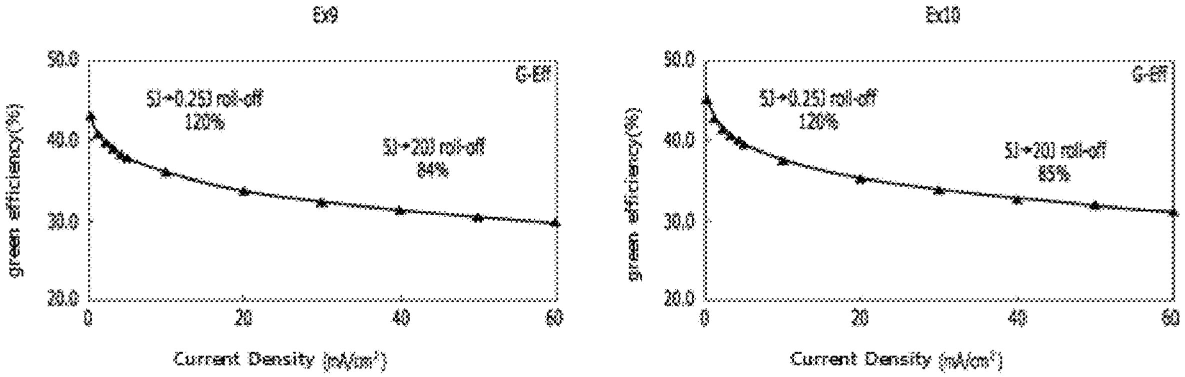
FIG. 17 is a graph showing green efficiency as a function of current density in Experimental Examples 9 and 10 of the present disclosure.
Figure 18:
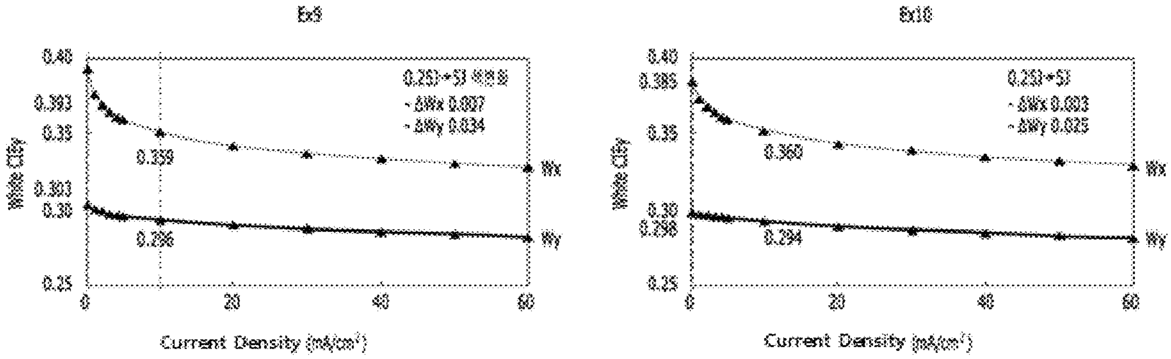
FIG. 18 is a graph showing white CIEy characteristics as a function of current density in Experimental Examples 9 and 10 of the present disclosure.

FIG. 16 is a graph showing blue efficiency as a function of current density in Experimental Examples 9 and 10 of the present disclosure. FIG. 17 is a graph showing green efficiency as a function of current density in Experimental Examples 9 and 10 of the present disclosure. FIG. 18 is a graph showing white color coordinate characteristics as a function of current density in Experimental Examples 9 and 10 of the present disclosure.

TABLE 3

| Characteristics | Ex9 | Ex10 |
|---|---|---|
| Blue efficiency (0.25 J/5 J) | 99% | 104% |
| Blue efficiency (20 J/5 J) | 93% | 93% |
| Green efficiency (0.25 J/5 J) | 120% | 120% |
| ΔWx (0.25 J-5 J) | 0.007 | 0.003 |
| ΔWy (0.25 J-5 J) | 0.034 | 0.025 |
| Blue Index | 100% | 107% |
| Lifespan(L95) | 100% | 107% |

In Experimental Examples of Table 3 and FIGS. 16 to 18, Experimental Example 10 (Ex10) has a light emitting device ED4 on a curved surface of a microlens array in common, like the structure of the light emitting device of FIG. 10 and includes the first and second blue light-emitting layers (1241 and 1242 in FIGS. 2 and 3) provided with the first and second hosts having a triplet energy level difference in the first blue light-emitting portion BEML1. In addition, in Experimental Example 10 (Ex10), the thickness of the first blue light-emitting layer 1241 was 0.3 times the total thickness T of the first blue light-emitting layer and the second blue light-emitting layer. Experimental Example 9 (Ex9) for comparison has the same structure of the light emitting device on the microlens array shown in FIG. 10, except that each blue light-emitting portion is provided as a single blue light-emitting layer. As shown in Table 3 and FIG. 16, the ratio of the blue efficiency at the current density of 0.25 $mA/cm^2$ to the blue efficiency at the current density of 5 $mA/cm^2$ is 99% for Experimental Example 9 (Ex9), but is 104% for Experimental Example 10 (Ex10). For example, when the first and second blue light-emitting layers separately provided with first and second hosts having different triplet energy levels are formed in at least one blue light-emitting portion of the light emitting device, as in the light emitting device and the light emitting display device of the present disclosure, the blue efficiency increases at a current density of 5 $mA/cm^2$ or less.

As shown in Table 3 and FIG. 16, the ratio of blue efficiency at the current density of 20 $mA/cm^2$ to the blue efficiency at the current density of 5 $mA/cm^2$ was 93% in both of Experimental Example 9 (Ex9) and Experimental Example 10 (Ex10). For example, there is no difference in the blue efficiency behavior at a current density of 5 $mA/cm^2$ or more between Experimental Examples 9 and 10 (Ex9, Ex10).

As shown in FIG. 16, in Experimental Example 9 (Ex9), the blue efficiency decreases and then increases at a current density change from 0.25 $mA/cm^2$ to 5 $mA/cm^2$, and gradually decreases at a current density change of 5 $mA/cm^2$ to 20 $mA/cm^2$. On the other hand, in Experimental Example 10 (Ex10), the blue efficiency is the highest at the current density of 0.25 $mA/cm^2$, and gradually decreases at the current density change from 0.25 $mA/cm^2$ to 5 $mA/cm^2$, and gradually decreases at the current density change from 5 $mA/cm^2$ to 20 $mA/cm^2$.

On the other hand, as shown in Table 3 and FIG. 17, the ratio of the green efficiency at the current density of 0.25 $mA/cm^2$ to the green efficiency at the current density of 5 $mA/cm^2$ is 120% for Experimental Example 9 (Ex9), and is 120% for Experimental Example 10 (Ex10).

For example, when driving at a blue low-gradation of 5 $mA/cm^2$ or less, the blue efficiency, which decreases in Experimental Example 9 (Ex9) including a single blue light-emitting layer, can be improved using two blue light-emitting layers as in Experimental Example 10 (Ex10). In addition, as shown in FIGS. 16 and 17, Experimental Example 10 (Ex10) has a change in blue luminous efficacy similar to the change in green luminous efficacy in the current density change from 0.25 $mA/cm^2$ to 5 $mA/cm^2$, so that the prominence of color of green during low-gradation driving can be prevented.

As shown in FIGS. 16 and 17, both Experimental Example 9 (Ex9) and Experimental Example 10 (Ex10) in the current density change from 5 $mA/cm^2$ to 20 $mA/cm^2$ exhibited a change in the blue luminous efficacy similar to the change in the green luminous efficacy, thus avoiding color abnormality at 5 $mA/cm^2$.

As shown in Table 3 and FIG. 18, the X color coordinate changes (ΔWx) of white in Experimental Example 9 (Ex9) and Experimental Example 10 (Ex10) were 0.007 and 0.003, respectively, and the Y color coordinate change (ΔWy) of white in Experimental Example 9 (Ex9) and Experimental Example 10 (Ex10) were 0.034 and 0.025, respectively. The change in white color coordinates at the current density change from 0.25 $mA/cm^2$ to 5 $mA/cm^2$, when implementing white color in Experimental Example 10 (Ex10), is higher than that when implementing white color according to Experimental Example 9 (Ex9).

For example, even when the microlens array is provided below the light emitting device as in the second embodiment of the present disclosure, when the first and second blue light-emitting layers having different triplet energy levels are provided in the blue light-emitting portion, the color deviation between blue and other color can be reduced even during low-gradation driving, so that the phenomenon in which a specific color is prominent when implementing white even at low-gradation current density change (0.25 $mA/cm^2$ to 5 $mA/cm^2$) can be prevented.

In addition, the blue indexes obtained by dividing the blue efficiency by the Y color coordinate upon blue light emission for Experimental Example 9 (Ex9) and Experimental Example 10 (Ex10) were 100% and 107%, respectively, which indicates an increase in blue efficiency.

The lifespan (L95) in Table 3 is the time taken until the luminance changes to 95% the initial luminance when driven at a current density of 40 $mA/cm^2$ at 40° C. In contrast, it can be seen that the lifespan is improved in Experimental Example 10 (Ex10), compared to Experimental Example 9 (Ex9).

For example, overall, in the light emitting device and the light emitting display device having increased green efficacy at low gradations based on the micro lens array provided under the light-emitting device according to the second embodiment of the present disclosure, when the blue light-emitting portion of the present disclosure is used as a two-layer structure of the first and second blue light-emitting layers having different host triplet energy levels, the thickness of the first blue light-emitting layer in contact with the hole transport layer or the electron blocking layer is set to be 0.2 to 0.5 times the total thickness of the blue light-emitting portion, it is possible to improve the blue efficiency at the low-gradation current density of 0.25 $mA/cm^2$ to 5 $mA/cm^2$, reduce the change in white color coordinates, and improve the blue efficiency in the blue light-emitting portion as well as the lifespan.

The second embodiment of the present disclosure has the same stack structure as the light emitting device according to the first embodiment of the present disclosure shown in FIG. 1 in that the microlens array is provided on the lower side of the light emitting device. When the thickness of the first blue light-emitting layer is 0.2 to 0.5 times the total of the first and second blue light-emitting layers, the same effects of improving luminous efficacy, reducing white deviation, and improving lifespan can be obtained.

In the light emitting device and light emitting display device of the present disclosure, the blue light-emitting portion is formed as a double layer structure, a first host having a high triplet energy level is used in the first blue light-emitting layer close to the hole transport layer in the blue light-emitting portion, and a second host having a lower triplet energy level than the first host is used in the second blue light-emitting layer close to the electron transport layer. As a result, the triplet excitons in the triplet energy level of the first blue light-emitting layer undergo Dexter energy transfer to the triplet energy level of the second blue light-emitting layer, are combined with the triplet excitons by TTF (triplet-triplet fusion), and then are converted into singlet excitons that can be used for light emission to improve the luminous efficacy.

In addition, the light emitting device and the light emitting display device of the present disclosure have different hosts having different triplet levels in the blue light-emitting layer having a two-layer structure, thereby concentrating a light-emitting region in the second blue light-emitting layer, in particular, at the interface between the first and second blue light-emitting layers, and solving the problem of lifespan reduction caused by accumulation of excitons at the interface between the hole transport layer and the blue light-emitting portion.

In addition, the light emitting device and the light emitting display device of the present disclosure improve the efficiency of the blue light-emitting layer, thereby mitigating the visual sensation of green, which is prominent during low gradation driving in a white light emitting device including a phosphorescent light-emitting layer of other colors other than blue, and preventing abnormality upon representation of white at low gradation. The light emitting display device of the present disclosure can structurally improve the luminous efficacy of blue, even when a microlens array having surface curvature is provided under the light emitting device to increase the light emission efficiency, thereby preventing color deviation when reproducing blue and other colors at low gradation and preventing color abnormality and color deviation even at low gradation driving.

The light emitting device and the light emitting display device including the same according to the present disclosure have the following effects.

In the light emitting device and light emitting display device of the present disclosure, the blue light-emitting portion is formed as a double layer structure, a first host having a high triplet energy level is used in the first blue light-emitting layer close to the hole transport layer in the blue light-emitting portion, and a second host having a lower triplet energy level than the first host is used in the second blue light-emitting layer close to the electron transport layer. As a result, the triplet excitons in the triplet energy level of the first blue light-emitting layer undergo Dexter energy transfer to the triplet energy level of the second blue light-emitting layer, are combined with the triplet excitons by TTF (triplet-triplet fusion), and then are converted into singlet excitons that can be used for light emission to improve the luminous efficacy.

In addition, the light emitting device and the light emitting display device of the present disclosure have different hosts having different triplet levels in the blue light-emitting layer having a two-layer structure, thereby concentrating a light-emitting region in the second blue light-emitting layer, in particular, at the interface between the first and second blue light-emitting layers, and solving the problem of lifespan reduction caused by accumulation of excitons at the interface between the hole transport layer and the blue light-emitting portion.

In addition, the light emitting device and the light emitting display device of the present disclosure improve the efficiency of the blue light-emitting layer, thereby mitigating the visual sensation of green, which is prominent during low gradation driving in a white light emitting device including a phosphorescent light-emitting layer of other colors other than blue, and preventing abnormality upon representation of white at low gradation.

Furthermore, the light emitting device and the light emitting display device of the present disclosure can structurally improve the luminous efficacy of blue, even when a microlens array having surface curvature is provided under the light emitting device to increase the light emission efficiency, thereby preventing color deviation when reproducing blue and other colors at low gradation and preventing color abnormality and color deviation even at low gradation driving.

The light emitting device and the light-emitting device display of the present disclosure can increase low gradation efficiency, thus providing low power consumption and reduced power consumption. In addition, they can be realized by dividing the areas of the light-emitting layers and the division of the host of the first and second blue light-emitting layers is possible by adjusting the internal end group when designing the host without adding materials. The light emitting device and the light-emitting device display of the present disclosure have an ESG (environmental/social/governance) effect based on the advantages of eco-friendliness, low power consumption, and process optimization.

A light emitting device according to one or more aspects of the present disclosure can comprise a first electrode and a second electrode facing each other on a substrate, and an intermediate layer comprising a first blue stack, a first charge generation layer, and a phosphorescent stack between the first electrode and the second electrode. The first blue stack can comprise a hole transport layer, a first blue light-emitting layer, a second blue light-emitting layer, and an electron transport layer in this order. The first blue light-emitting layer can comprise a first host and a blue dopant, and the second blue light-emitting layer comprises a second host and the blue dopant, and a triplet energy level of the first host can be greater than a triplet energy level of the second host and can be smaller than a triplet energy level of the blue dopant.

In a light emitting device according to one or more aspects of the present disclosure, a triplet energy level of the hole transport layer of the first blue stack can be greater than a triplet energy level of the first host.

In a light emitting device according to one or more aspects of the present disclosure, a HOMO level of the first host can be lower than a HOMO level of the hole transport layer of the first blue stack, and can be equal to or higher than a HOMO level of the second host.

In a light emitting device according to one or more aspects of the present disclosure, a thickness of the first blue light-emitting layer can be 0.2 to 0.5 times a total thickness of the first blue light-emitting layer and the second blue light-emitting layer.

In a light emitting device according to one or more aspects of the present disclosure, the intermediate layer can further comprise a second charge generation layer and a second blue stack between the phosphorescent stack and the second electrode.

In a light emitting device according to one or more aspects of the present disclosure, the second blue stack can comprise a third blue light-emitting layer and a fourth blue light-emitting layer in this order, and the third blue light-emitting layer can comprise a third host and the blue dopant, and the fourth blue light-emitting layer comprises a fourth host and the blue dopant.

In a light emitting device according to one or more aspects of the present disclosure, a triplet energy level of the third host can be greater than a triplet energy level of the fourth host and can be smaller than a triplet energy level of the blue dopant.

In a light emitting device according to one or more aspects of the present disclosure, the phosphorescent stack can comprise a red light-emitting layer, a yellow green light-emitting layer, and a green light-emitting layer close to the first charge generation layer.

In a light emitting device according to one or more aspects of the present disclosure, a first vertical distance from an interface between the first blue light-emitting layer and the second blue light-emitting layer to the center of the green light-emitting layer can be smaller than a second vertical distance from a center of the green light-emitting layer to a center of the blue light-emitting layer of the second blue stack.

In a light emitting device according to one or more aspects of the present disclosure, the first vertical distance can be 80 nm to 105 nm and the second vertical distance can be 130 nm to 166 nm.

In a light emitting device according to one or more aspects of the present disclosure, the first electrode, the intermediate layer, and the second electrode can be provided along a curve provided on a lower surface of the first electrode.

In a light emitting device according to one or more aspects of the present disclosure, in the intermediate layer, the first vertical distance can be 130 nm to 160 nm, and the second vertical distance can be 170 nm to 230 nm.

In a light emitting device according to one or more aspects of the present disclosure, a light emission zone is concentrated at the interface between the first blue light-emitting layer and the second blue light-emitting layer contacting each other.

A light emitting display device according to one or more aspects of the present disclosure can comprise a first electrode and a second electrode facing each other on a substrate and an intermediate layer comprising a first blue stack, a first charge generation layer, a phosphorescent stack, and a second blue stack between the first electrode and the second electrode. The first blue stack can comprise a first hole transport layer, a first blue light-emitting portion, and a first electron transport layer in this order. The second blue stack can comprise a second hole transport layer, a second blue light-emitting portion, and a second electron transport layer in this order. At least one of the first blue light-emitting portion or the second blue light-emitting portion can have first and second blue light-emitting layers, and the first and second blue light-emitting layers can have the same blue dopant and have different first and second hosts. A triplet energy level of the first host can be greater than a triplet energy level of the second host and can be smaller than a triplet energy level of the blue dopant.

In a light emitting device according to one or more aspects of the present disclosure, a highest occupied molecular orbital (HOMO) level of the first host can be lower than a HOMO level of the adjacent first hole transport layer or second hole transport layer, and can be equal to or higher than a HOMO level of the second host.

In a light emitting device according to one or more aspects of the present disclosure, a thickness of the first blue light-emitting layer can be 0.2 to 0.5 times a total thickness of the first blue light-emitting layer and the second blue light-emitting layer.

In a light emitting device according to one or more aspects of the present disclosure, the phosphorescent stack can comprise a red light-emitting layer, a yellow green light-emitting layer, and a green light-emitting layer close to the first charge generation layer.

In a light emitting device according to one or more aspects of the present disclosure, the first electrode, the intermediate layer, and the second electrode can be provided along a curve provided on a lower surface of the first electrode.

A light emitting display device according to one or more aspects of the present disclosure can comprise a substrate including a plurality of sub-pixels, a thin film transistor at each sub-pixel on the substrate and a light emitting device connected to the thin film transistor and provided on an insulating film having a surface curvature. The light emitting device can comprise a first electrode and a second electrode facing each other, and a first blue stack, a first charge generation layer, a phosphorescent stack, and a second blue stack between the first electrode and the second electrode. The first blue stack can comprise a first hole transport layer, a first blue light-emitting portion, and a first electron transport layer in this order. The second blue stack can comprise a second hole transport layer, a second blue light-emitting portion, and a second electron transport layer in this order. At least one of the first blue light-emitting portion or the second blue light-emitting portion can have first and second blue light-emitting layers, and the first and second blue light-emitting layers have the same blue dopant and have different first and second blue hosts. A triplet energy level of the first host can be greater than a triplet energy level of the second host and can be smaller than a triplet energy level of the blue dopant.

In a light emitting display device according to one or more aspects of the present disclosure, a HOMO level of the first host can be lower than a HOMO level of the adjacent first hole transport layer or second hole transport layer, and is equal to or higher than a HOMO level of the second host.

In a light emitting display device according to one or more aspects of the present disclosure, a thickness of the first blue light-emitting layer can be 0.2 to 0.5 times a total thickness of the first blue light-emitting layer and the second blue light-emitting layer.

In a light emitting display device according to one or more aspects of the present disclosure, the phosphorescent stack can comprise a red light-emitting layer, a yellow green light-emitting layer, and a green light-emitting layer close to the first charge generation layer.

In a light emitting display device according to one or more aspects of the present disclosure, a first vertical distance from a center of the first blue light-emitting portion to a center of the green light-emitting layer can be 130 nm to 160 nm, and a second vertical distance from a center of the green light-emitting layer to a center of the second blue light-emitting portion can be 170 nm to 230 nm.

It will be apparent to those skilled in the art that various modifications and variations can be made in the disclosure without departing from the spirit or scope of the disclosure. Thus, it is intended that the disclosure covers such modifications and variations thereof, provided they fall within the scope of the appended claims and their equivalents.

What is claimed is:

1. A light emitting device comprising:

a first electrode and a second electrode facing each other on a substrate; and an intermediate layer comprising a first blue stack, a first charge generation layer, and a phosphorescent stack between the first electrode and the second electrode, wherein the first blue stack comprises a hole transport layer, a first blue light-emitting layer, a second blue light-emitting layer, and an electron transport layer in this order, wherein the first blue light-emitting layer comprises a first host and a blue dopant, and the second blue light-emitting layer comprises a second host and the blue dopant, wherein a triplet energy level of the first host is greater than a triplet energy level of the second host and is smaller than a triplet energy level of the blue dopant, and wherein lowest unoccupied molecular orbital (LUMO) energy levels of the first host and the second host are equal to each other, and the LUMO energy level of each of the first host and the second host is higher than that of the blue dopant.

2. The light emitting device according to claim 1, wherein a triplet energy level of the hole transport layer of the first blue stack is greater than the triplet energy level of the first host.

3. The light emitting device according to claim 1, wherein a highest occupied molecular orbital (HOMO) level of the first host is lower than a HOMO level of the hole transport layer of the first blue stack, and is equal to or higher than a HOMO level of the second host.

4. The light emitting device according to claim 1, wherein a thickness of the first blue light-emitting layer is about 0.2 to 0.5 times a total thickness of the first blue light-emitting layer and the second blue light-emitting layer.

5. The light emitting device according to claim 1, wherein the intermediate layer further comprises a second charge generation layer and a second blue stack between the phosphorescent stack and the second electrode.

6. The light emitting device according to claim 5, wherein the second blue stack comprises a third blue light-emitting layer and a fourth blue light-emitting layer in this order, the third blue light-emitting layer comprises a third host and the blue dopant, and the fourth blue light-emitting layer comprises a fourth host and the blue dopant, and a triplet energy level of the third host is greater than a triplet energy level of the fourth host and is smaller than the triplet energy level of the blue dopant.

7. The light emitting device according to claim 5, wherein the phosphorescent stack comprises a red light-emitting layer, a yellow green light-emitting layer, and a green light-emitting layer close to the first charge generation layer.

8. The light emitting device according to claim 7, wherein a first vertical distance from an interface between the first blue light-emitting layer and the second blue light-emitting layer to a center of the green light-emitting layer is smaller than a second vertical distance from the center of the green light-emitting layer to a center of a blue light-emitting layer of the second blue stack.

9. The light emitting device according to claim 8, wherein the first vertical distance is about 80 nm to 105 nm and the second vertical distance is about 130 nm to 166 nm.

10. The light emitting device according to claim 8, wherein the first electrode, the intermediate layer, and the second electrode are provided along a curve provided on a lower surface of the first electrode.

11. The light emitting device according to claim 10, wherein, in the intermediate layer, the first vertical distance is about 130 nm to 160 nm, and the second vertical distance is about 170 nm to 230 nm.

12. The light emitting device according to claim 1, wherein a light emission zone is concentrated at an interface between the first blue light-emitting layer and the second blue light-emitting layer contacting each other.

13. The light emitting device of claim 1, wherein the second blue light-emitting layer has a higher light-emitting intensity than that of the first blue light-emitting layer.

14. A light emitting device comprising:

a first electrode and a second electrode facing each other on a substrate; and an intermediate layer comprising a first blue stack, a first charge generation layer, a phosphorescent stack, and a second blue stack between the first electrode and the second electrode, wherein the first blue stack comprises a first hole transport layer, a first blue light-emitting portion, and a first electron transport layer in this order, wherein the second blue stack comprises a second hole transport layer, a second blue light-emitting portion, and a second electron transport layer in this order, wherein at least one of the first blue light-emitting portion or the second blue light-emitting portion has first and second blue light-emitting layers, and the first and second blue light-emitting layers have a blue dopant and have different first and second hosts, wherein a triplet energy level of the first host is greater than a triplet energy level of the second host and is smaller than a triplet energy level of the blue dopant, and wherein lowest unoccupied molecular orbital (LUMO) energy levels of the first host and the second host are equal to each other, and the LUMO energy level of each of the first host and the second host is higher than that of the blue dopant.

15. The light emitting device according to claim 14, wherein a highest occupied molecular orbital (HOMO) level of the first host is lower than a HOMO level of an adjacent first hole transport layer or second hole transport layer, and is equal to or higher than a HOMO level of the second host.

16. The light emitting device according to claim 14, wherein a thickness of the first blue light-emitting layer is about 0.2 to 0.5 times a total thickness of the first blue light-emitting layer and the second blue light-emitting layer.

17. The light emitting device according to claim 14, wherein the phosphorescent stack comprises a red light-emitting layer, a yellow green light-emitting layer, and a green light-emitting layer close to the first charge generation layer.

18. The light emitting device according to claim 14, wherein the first electrode, the intermediate layer, and the second electrode are provided along a curve provided on a lower surface of the first electrode.

19. A light emitting display device comprising:

a substrate including a plurality of sub-pixels;

a thin film transistor at each of the plurality of sub-pixels on the substrate; and a light emitting device connected to the thin film transistor and provided on an insulating film having a surface curvature, wherein the light emitting device comprises a first electrode and a second electrode facing each other, and a first blue stack, a first charge generation layer, a phosphorescent stack, and a second blue stack between the first electrode and the second electrode, wherein the first blue stack comprises a first hole transport layer, a first blue light-emitting portion, and a first electron transport layer in this order, wherein the second blue stack comprises a second hole transport layer, a second blue light-emitting portion, and a second electron transport layer in this order, wherein at least one of the first blue light-emitting portion or the second blue light-emitting portion has first and second blue light-emitting layers, and the first and second blue light-emitting layers have a blue dopant and have different first and second blue hosts, wherein a triplet energy level of a first host is greater than a triplet energy level of a second host and is smaller than a triplet energy level of the blue dopant, and wherein lowest unoccupied molecular orbital (LUMO) energy levels of the first host and the second host are equal to each other, and the LUMO energy level of each of the first host and the second host is higher than that of the blue dopant.

20. The light emitting display device according to claim 19, wherein a highest occupied molecular orbital (HOMO) level of the first host is lower than a HOMO level of an adjacent first hole transport layer or second hole transport layer, and is equal to or higher than a HOMO level of the second host.

21. The light emitting display device according to claim 19, wherein a thickness of the first blue light-emitting layer is about 0.2 to 0.5 times a total thickness of the first blue light-emitting layer and the second blue light-emitting layer.

22. The light emitting display device according to claim 19, wherein the phosphorescent stack comprises a red light-emitting layer, a yellow green light-emitting layer, and a green light-emitting layer close to the first charge generation layer.

23. The light emitting display device according to claim 22, wherein a first vertical distance from a center of the first blue light-emitting portion to a center of the green light-emitting layer is about 130 nm to 160 nm, and a second vertical distance from the center of the green light-emitting layer to a center of the second blue light-emitting portion is about 170 nm to 230 nm.

* * * * *